(12) United States Patent
Lim et al.

(10) Patent No.: US 11,145,654 B2
(45) Date of Patent: Oct. 12, 2021

(54) FIELD EFFECT TRANSISTOR (FET) COMPRISING CHANNELS WITH SILICON GERMANIUM (SIGE)

(71) Applicant: QUALCOMM Incorporated, San Diego, CA (US)

(72) Inventors: Kwanyong Lim, San Diego, CA (US); Stanley Seungchul Song, San Diego, CA (US); Jun Yuan, San Diego, CA (US); Kern Rim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/654,774

(22) Filed: Oct. 16, 2019

(65) Prior Publication Data

US 2021/0118883 A1    Apr. 22, 2021

(51) Int. Cl.
| | |
|---|---|
| *H01L 27/092* | (2006.01) |
| *H01L 21/02* | (2006.01) |
| *H01L 21/8238* | (2006.01) |
| *H01L 29/06* | (2006.01) |
| *H01L 29/08* | (2006.01) |
| *H01L 29/10* | (2006.01) |
| *H01L 29/423* | (2006.01) |
| *H01L 29/66* | (2006.01) |
| *H01L 29/78* | (2006.01) |

(52) U.S. Cl.
CPC .... *H01L 27/0924* (2013.01); *H01L 21/02532* (2013.01); *H01L 21/823807* (2013.01); *H01L 21/823814* (2013.01); *H01L 21/823821* (2013.01); *H01L 21/823871* (2013.01); *H01L 29/0673* (2013.01); *H01L 29/0847* (2013.01); *H01L 29/1037* (2013.01); *H01L 29/42392* (2013.01); *H01L 29/66795* (2013.01); *H01L 29/785* (2013.01)

(58) Field of Classification Search
CPC .......... H01L 27/0924; H01L 27/42392; H01L 29/42392
See application file for complete search history.

(56) References Cited

U.S. PATENT DOCUMENTS

| | | | |
|---|---|---|---|
| 9,620,590 B1* | 4/2017 | Bergendahl | H01L 29/78696 |
| 2008/0001171 A1* | 1/2008 | Tezuka | H01L 29/1054 257/191 |
| 2018/0122642 A1* | 5/2018 | Raisanen | H01L 21/28088 |
| 2020/0135737 A1* | 4/2020 | Liaw | H01L 21/823892 |

* cited by examiner

*Primary Examiner* — Daniel P Shook
(74) *Attorney, Agent, or Firm* — Loza & Loza, LLP

(57) ABSTRACT

A device comprising a substrate and a first transistor formed over the substrate. The first transistor includes a first source disposed over the substrate, a first drain disposed over the substrate, a first plurality of channels coupled to the first source and the first drain, and a first gate surrounding the first plurality of channels. The first plurality of channels is located between the first source and the first drain. At least one channel includes silicon germanium (SiGe). The transistor is a field effect transistor (FET). The transistor is a gate all around (GAA) FET. The transistor may be configured to operate as a negative channel metal oxide semiconductor (NMOS) transistor. The transistor may be configured to operate as a positive channel metal oxide semiconductor (PMOS) transistor.

34 Claims, 26 Drawing Sheets

FIELD EFFECT TRANSISTOR (FET) COMPRISING CHANNELS WITH SILICON GERMANIUM (SIGE)

FIELD

Various features relate to integrated devices, but more specifically to integrated devices comprising field effect transistors (FETs).

BACKGROUND

FIG. 1 illustrates a complementary metal-oxide-semiconductor (CMOS) structure 100 that includes a positive channel metal oxide semiconductor (PMOS) transistor 120 and a negative channel metal oxide semiconductor (NMOS) transistor 140. The PMOS transistor 120 is formed over a N well 102, while the NMOS transistor 140 is formed over a P well 104. Both the N well 102 and the P well 104 are each formed in a substrate 105. An integrated device, such as an integrated circuit (IC) may include a plurality of CMOS structures 100 that each includes a PMOS transistor 120 and a NMOS transistor 140.

There is an ongoing need to improve the performance of transistors in an integrated device.

SUMMARY

Various features relate to integrated devices, but more specifically to integrated devices comprising field effect transistors (FETs).

One example provides a device comprising a substrate and a first transistor formed over the substrate. The first transistor includes a first source disposed over the substrate, a first drain disposed over the substrate, a first plurality of channels coupled to the first source and the first drain, and a first gate surrounding the first plurality of channels. The first plurality of channels is located between the first source and the first drain. At least one channel from the first plurality of channels includes silicon germanium (SiGe).

One example provides an integrated device that includes a substrate, a first transistor formed over the substrate, and a second transistor formed over the substrate. The first transistor includes a first source disposed over the substrate; a first drain disposed over the substrate; a first plurality of channels coupled to the first source and the first drain, the first plurality of channels located between the first source and the first drain, wherein at least one channel from the first plurality of channels comprises silicon germanium (SiGe); and a first gate surrounding the first plurality of channels. The second transistor includes a second source disposed over the substrate; a second drain disposed over the substrate; a second plurality of channels coupled to the second source and the second drain, the second plurality of channels located between the second source and the second drain, wherein at least one channel from the second plurality of channels comprises silicon germanium (SiGe); and a second gate surrounding the second plurality of channels.

One example provides an apparatus that includes a substrate, a first transistor means formed over the substrate, and a second transistor means formed over the substrate. The first transistor means includes a first source disposed over the substrate; a first drain disposed over the substrate; a first plurality of channels coupled to the first source and the first drain, the first plurality of channels located between the first source and the first drain, wherein at least one channel from the first plurality of channels comprises silicon germanium (SiGe); and a first gate surrounding the first plurality of channels. The second transistor means includes a second source disposed over the substrate; a second drain disposed over the substrate; a second plurality of channels coupled to the second source and the second drain, the second plurality of channels located between the second source and the second drain, wherein at least one channel from the second plurality of channels comprises silicon germanium (SiGe); and a second gate surrounding the second plurality of channels.

One example provides a method for fabricating an integrated device. The method provides a substrate. The method forms a first transistor over the substrate. Forming the first transistor includes forming a first source over the substrate; forming a first drain over the substrate; forming a first plurality of channels between the first source and the first drain, where at least one channel from the first plurality of channels comprises silicon germanium (SiGe); and forming a first gate surrounding the first plurality of channels.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device comprising a substrate and a transistor formed over the substrate. The transistor includes a first source disposed over the substrate, a first drain disposed over the substrate, a first plurality of channels coupled to the first source and the first drain, and a first gate surrounding the first plurality of channels. The first plurality of channels is located between the first source and the first drain. At least one channel includes silicon germanium (SiGe). The transistor includes a field effect transistor (FET). The transistor includes a gate all around (GAA) FET. The transistor may be configured to operate as a negative channel metal oxide semiconductor (NMOS) transistor. The transistor may be configured to operate as a positive channel metal oxide semiconductor (PMOS) transistor. The transistor described in the disclosure provides improved performance through the use of silicon germanium (SiGe) in the plurality of channels of the transistor, to reduce a minimum voltage (Vt) required to induce a current flow between a source and a drain. The reduced minimum voltage (Vt) may be applicable to a NMOS transistor, PMOS transistor, or combinations thereof.

Exemplary Gate-All-Around Field Effect Transistor (FET) Comprising Channels With Silicon Germanium (SiGe)

Figure 1:
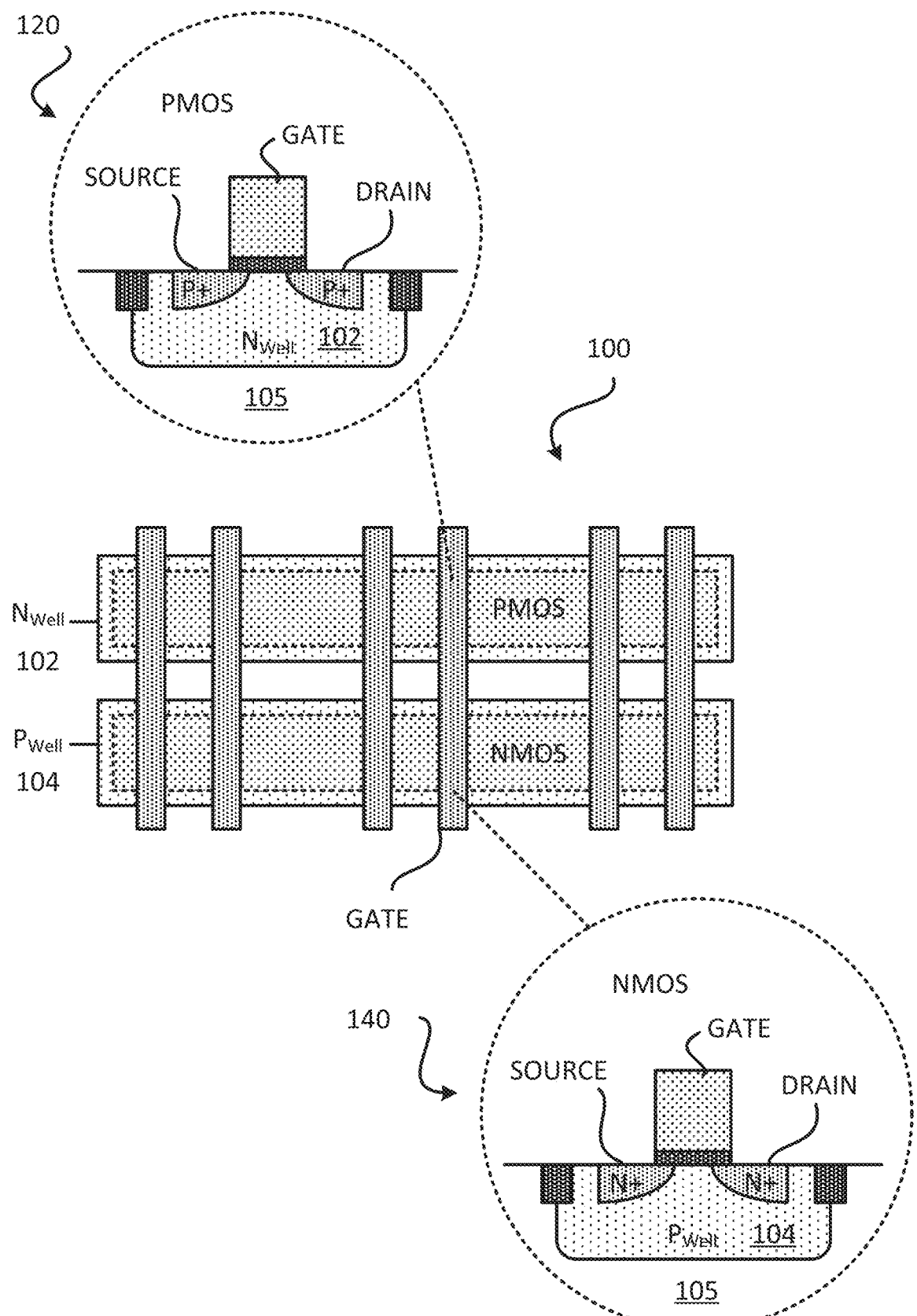
FIG. 1 illustrates a view of a structure that includes a positive channel metal oxide semiconductor (PMOS) transistor and a negative channel metal oxide semiconductor (NMOS) transistor.
Figure 2:
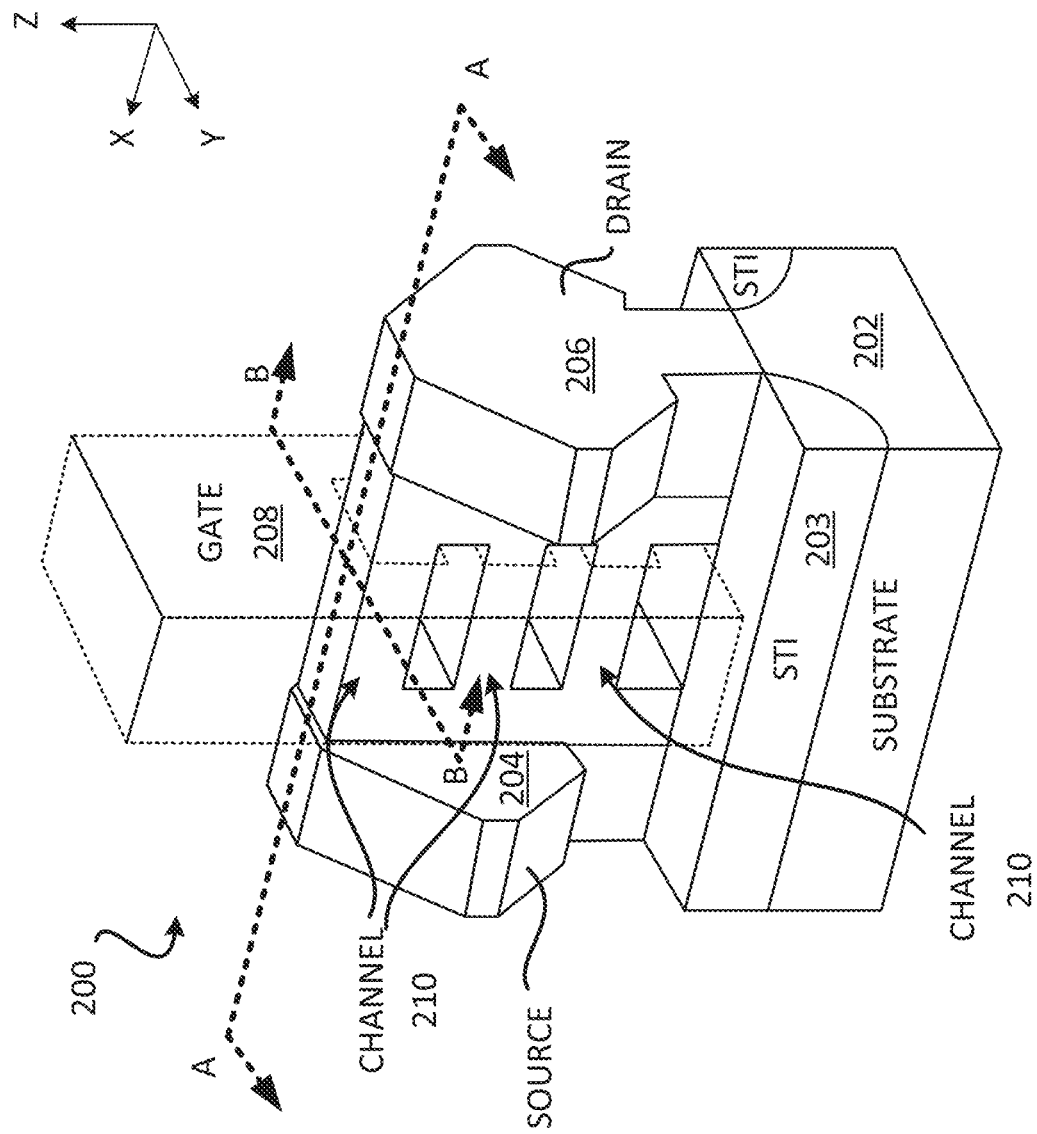
FIG. 2 illustrates an exemplary view of a gate-all-around field effect transistor (FET) formed over a substrate.

FIG. 2 illustrates an example of a transistor 200 that is formed over a substrate. The transistor 200 may include a gate-all-around (GAA) field effect transistor (FET). In particular, the transistor 200 include a multi-channel gate-all-around FET. The transistor 200 may be configured as (i) a negative channel metal oxide semiconductor (NMOS) transistor, or (ii) a positive channel metal oxide semiconductor (PMOS) transistor. As will be further described below, a complementary metal-oxide-semiconductor (CMOS) structure may be defined by a first transistor (e.g., 200) configured as a NMOS transistor and a second transistor (e.g., 200) configured as a PMOS transistor. The transistor 200 may be a transistor means (e.g., first transistor means, second transistor means).

As shown in FIG. 2, the transistor 200 is formed over the substrate 202. The substrate 202 may include silicon (Si). The transistor 200 (e.g., first transistor, second transistor) includes a source 204 (e.g., first source, second source), a drain 206 (e.g., first drain, second drain), a gate 208 (e.g., first gate, second gate), and a plurality of channels 210 (e.g., first plurality of channels, second plurality of channels). In some implementations, the substrate 202 may be considered part of the transistor 200. The substrate 202 may include one or more shallow trench isolations (STIs) 203. The substrate 202 may be a P substrate or a N substrate. Although not shown, the substrate 202 may include wells, such as a P-well and a N-well.

FIG. 2 illustrates the source 204 is disposed (e.g., formed, located) over the substrate 202. Similarly, the drain 206 is disposed (e.g., formed, located) over the substrate 202. The plurality of channels 210 is coupled to the source 204 and the drain 206. The plurality of channels 210 is coupled to the source 204 and the drain 206, such that the plurality of channels 210 is located between the source 204 and the drain 206. The plurality of channels 210 is configured to allow a current to flow between the source 204 and the drain 206 when a voltage (Vt) is applied between the gate 208 and the substrate 202. The plurality of channels 210 may include a first channel, a second channel and a third channel. The first channel, the second channel and the third channel may be stacked vertically above one another, with a space (for a gate) between each channel. Different implementations may include a different number of channels 210.

One or more of the channels from the plurality of channels 210 may include silicon germanium (SiGe). In some implementations, one or more channels may include silicon (Si) with a concentration of germanium (Ge) in a range of approximately 2-8 percent (%). In some implementations, the concentration percentage, as used in the disclosure, may be the number of atoms of Ge relative to the number of atoms of Si. However, the concentration percentage may be representative of something else, such as mass. The addition of germanium in the channels helps reduce the minimum voltage (Vt) required to induce a current flow between the source 204 and the drain 206. In some implementations, there may be no noticeable Vt change for NMOS transistor (e.g., NFET), but the Vt for the PMOS transistor (e.g., PFET) may decrease as a function of the Ge percentage due to the SiGe channel's valance band offset to Si substrate valence band. Thus, the transistor 200 may require less energy to operate, and ultimately a device and/or an integrated device that includes the transistor 200 may also require less energy to operate. The minimum voltage (Vt) required to induce a current flow, may be applicable to a PMOS transistor and/or a NMOS transistor. In some implementations, the minimum voltage (Vt) required to induce a current flow is approximately in a range of 0.15-0.3 volts (V), for a PMOS transistor and/or a NMOS transistor. The concentration of the Ge in the plurality of channels 210 may be chosen to produce a desired minimum voltage (Vt) requirement to induce a current flow. The concentration of the Ge in the plurality of channels 210 may be the same for all the plurality channels 210, or some of the channels 210 may have different concentration of Ge. In some implementations, some of the channels 210 may not have a concentration of Ge. It is noted that the use of SiGe channels is not limited to gate-all-around FETs. Channels that include SiGe may also be used in other types of FETs.

The gate 208 is located between the source 204 and the drain 206. The gate 208 is formed such as to wrap around or surround the plurality of channels 210. For example, the gate 208 may surround the four sides of a channel from the plurality of channels 210. It is noted that the size and shape of the transistor 200 is exemplary. Moreover, some or all of the components of the transistor 200 shown may not be to scale. In addition, for the purpose of clarity, not all components may be shown in FIG. 2.

As mentioned above, the transistor 200 may be configured to operate as a NMOS transistor or a PMOS transistor. To operate as a NMOS transistor, the source 204 and the drain 206 may each include a N type dopant (N+). Moreover, at least some of the transistor 200 may be formed over a P-well formed in a substrate. To operate as a PMOS transistor, the source 204 and the drain 206 may each include P type dopant (P+). Moreover, at least some of the transistor 200 may be formed over a N-well formed in a substrate. Examples of how the transistor 200 may be configured to operate as a NMOS transistor or a PMOS transistor are further described below in at least FIGS. 7-12. As will be further described below, a first transistor configured to operate as a NMOS transistor and a second transistor configured to operate as a PMOS transistor, may be use to form and define a CMOS structure in an integrated device.

Figure 3:
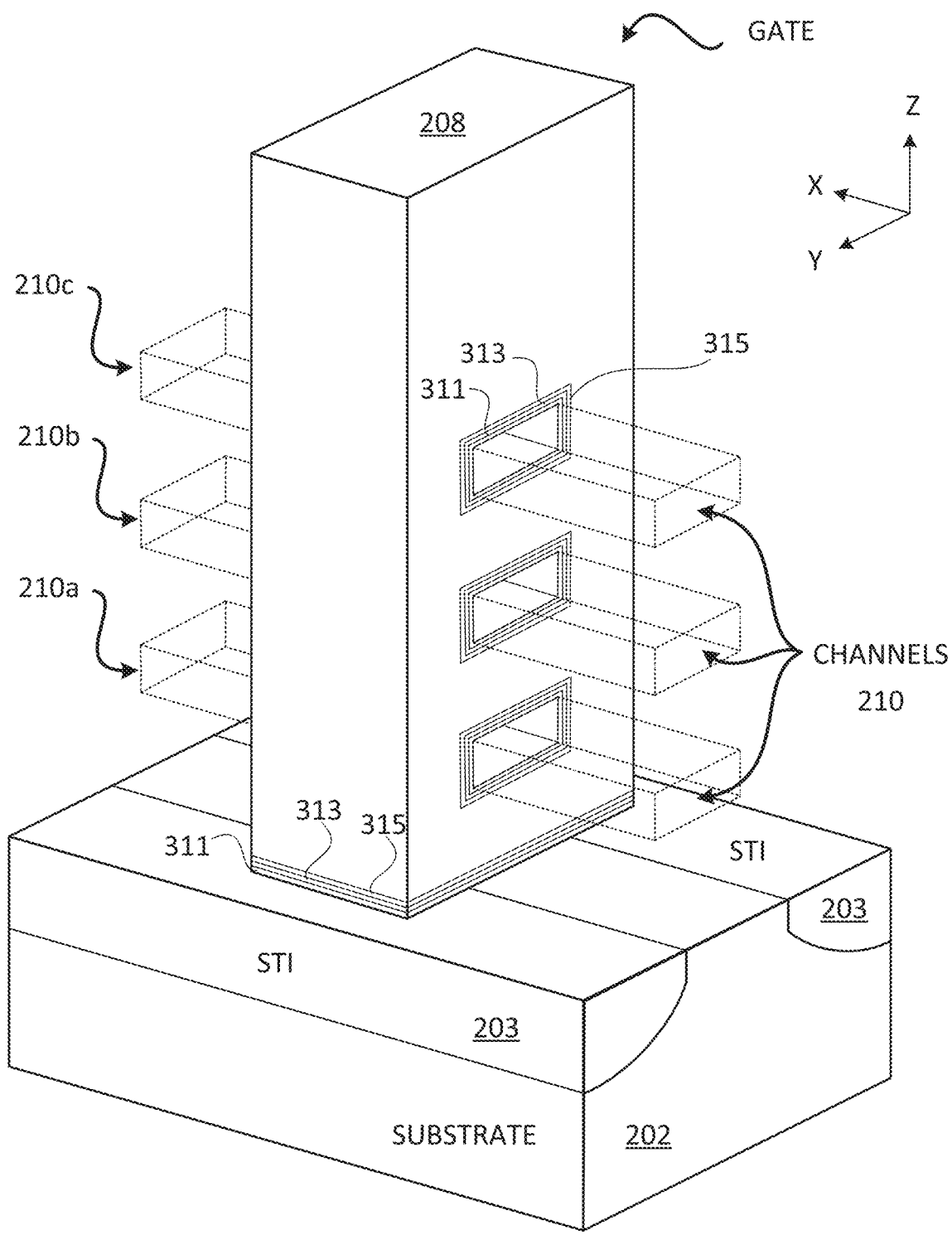
FIG. 3 illustrates an exemplary view of a gate surrounding channels formed over a substrate.

FIG. 3 illustrates an exemplary view of a plurality channels surrounded by a gate. In some implementations, the plurality of channels of a transistor may be separated from the gate by one or more layers of materials between the channel and the gate. These layers may be considered part of the gate in some implementations. Moreover, one or more layers of materials may be located between the gate 208 and the substrate 202.

FIG. 3 illustrates the gate 208 is formed over the substrate 202. The substrate 202 includes STIs 203. Some of the gate 208 may be formed over the STIs 203. FIG. 3 illustrates that there is one or more layers between the gate 208 and the substrate 202. FIG. 3 illustrates a first layer 311, a second layer 313 and a third layer 315, between the gate 208 and the substrate 202. The first layer 311 may include a high K dielectric layer, the second layer 313 may include a first metal layer (e.g., titanium nitride (Tin)), and the third layer 315 may be a work function metal layer (e.g., TiAlxCy). The high K dielectric layer may include HfO, HfSiO, HfSiON, HfLaO, HfLaSiO, HfLaSiON, HfAlO, HfAlSiO, HfAlSiON, and/or combinations thereof. The work function metal layer may include TiN, TaN, TiAl(C), TiAlxCy, W, and/or combinations thereof. The gate 208 may include a low resistive metal (e.g., Tungsten). In some implementations, the first layer 311, the second layer 313 and/or the third layer 315 may be considered part of the gate 208.

The gate 208 surrounds the plurality of channels 210 (e.g., 210a, 210b, 210c). There may be one or more layers between the gate 208 and the plurality of channels 210 (e.g., 210a, 210b, 210c). For example, there may be the first layer 311, the second layer 313 and/or the third layer 315, between the gate 208 and plurality of channels 210 (e.g., 210a, 210b, 210c). The thickness of the various layers (e.g., 311, 313, 315) may vary. For example, the first layer 311 may have a thickness in a range of 1-3 nanometers (nm), the second layer 313 may have a thickness in a range of 1-4 nm, and the third layer 315 may have a thickness in a range of 1-5 nm. In some implementations, the variations in thicknesses of the various layers may vary based on whether the transistor 200 is configured to operate as a NMOS transistor or a PMOS transistor. It is noted that some implementations may not include all of the above layers (e.g., first layer 311, second layer 313, third layer 315). In some implementations, there may be additional layers.

Figure 4:
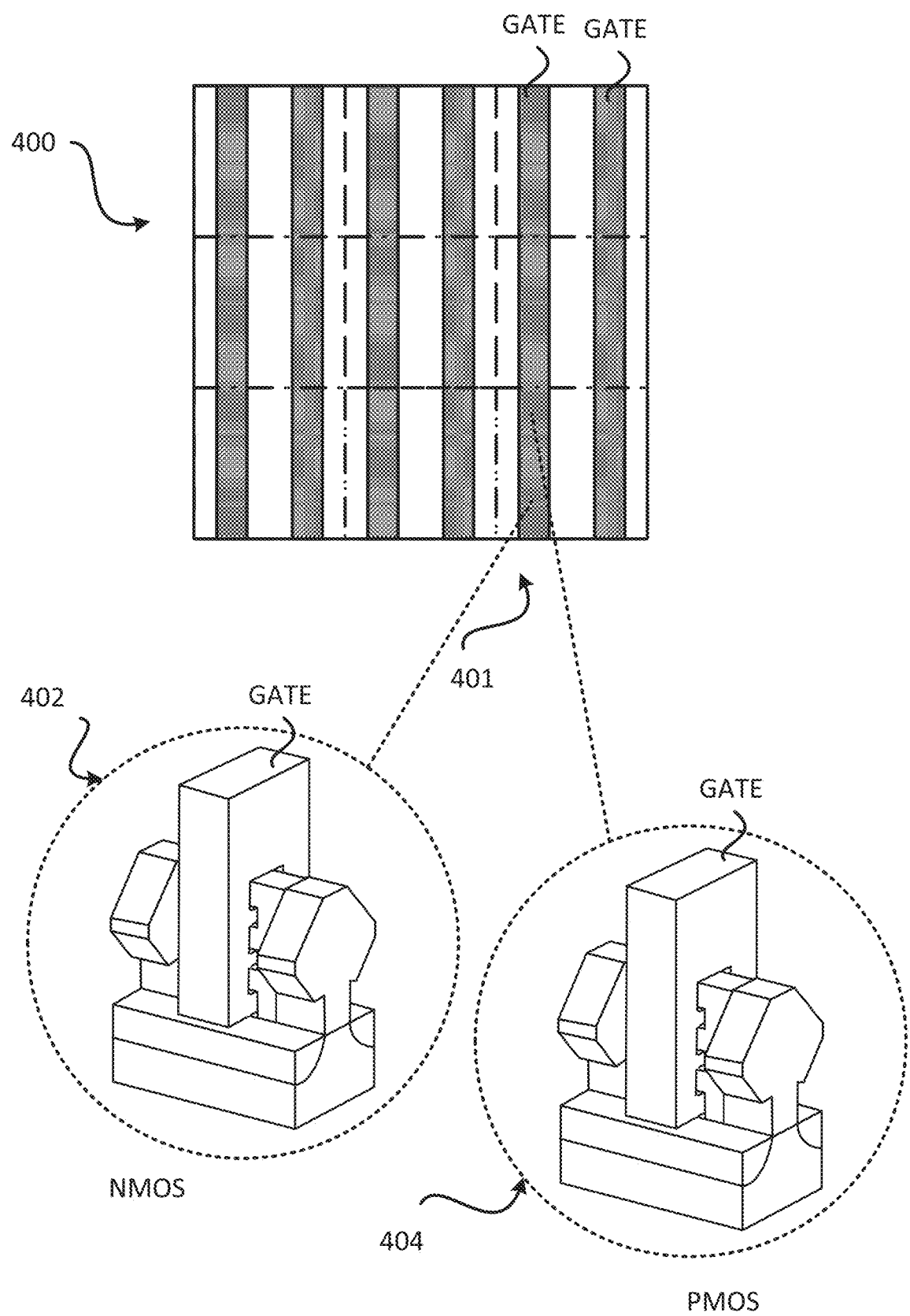
FIG. 4 illustrates a cell of an integrated device that includes gate-all-around FETs.

FIG. 4 illustrates a cell 400 of an integrated device. The cell 400 may represent a device level cell of an integrated device. An integrated device is further described in FIG. 15. As shown in FIG. 4, the cell 400 includes a CMOS structure 401 that is defined by a NMOS transistor 402 (e.g., first transistor) and a PMOS transistor 404 (e.g., second transistor). The NMOS transistor 402 may be the transistor 200, where the source and the drain include N type dopant (N+). Similarly, the PMOS transistor 404 may be the transistor 200, where the source and the drain include P type dopant (P+). The NMOS transistor 402 and the PMOS transistor 404 may share the same gate or have different gates. More detailed examples of NMOS transistors and PMOS transistors are further described below in FIGS. 7-12. As will be further described below, an integrated device may include a plurality of cells 400, each cell having a same or different arrangement of CMOS structures, NMOS transistors, and/or PMOS transistors.

Figure 5:
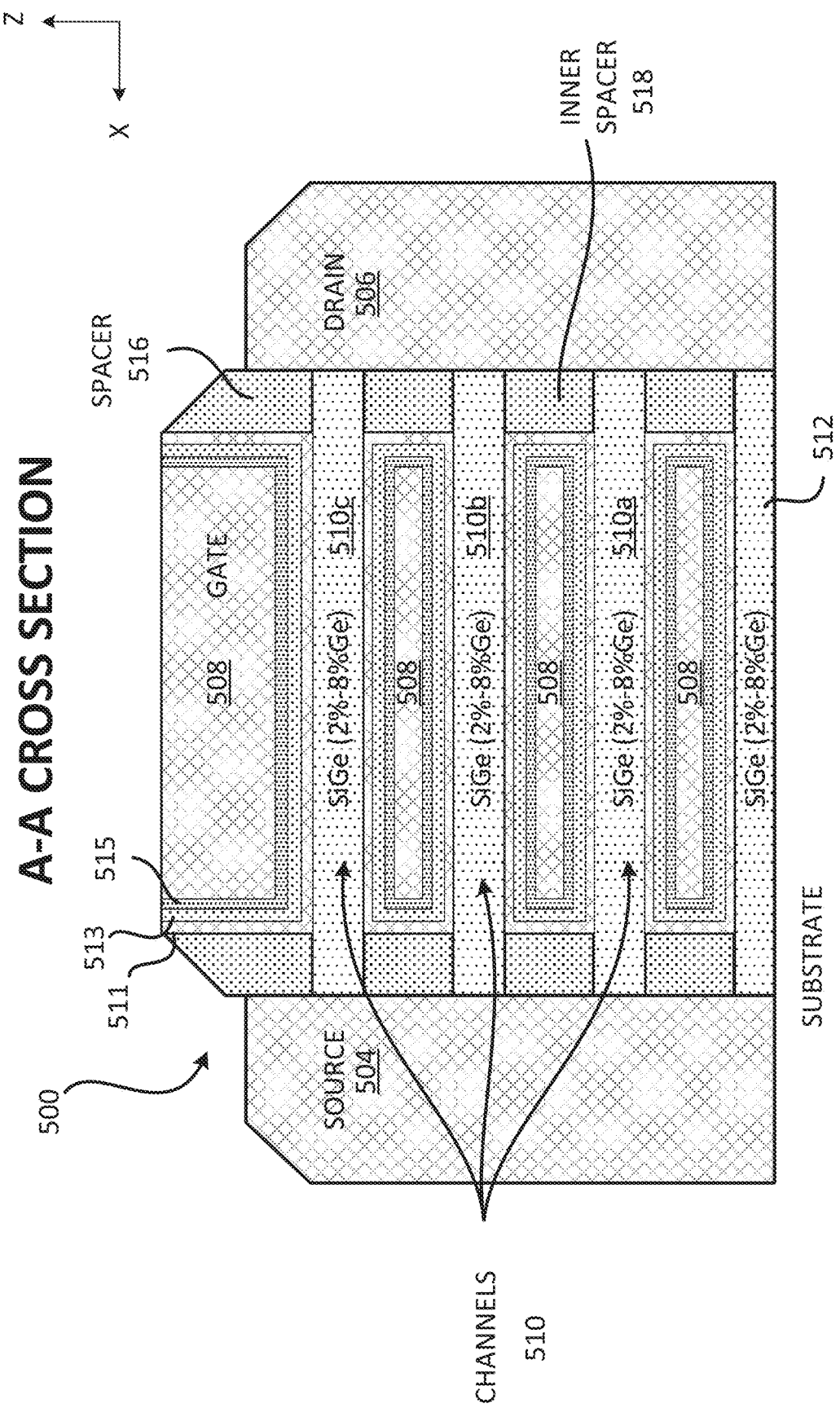
FIG. 5 illustrates an exemplary view of a first cross section of a gate-all-around FET.

FIG. 5 illustrates a profile view of a transistor 500. The transistor 500 of FIG. 5, may represent a view across the cross-section AA of the transistor 200 of FIG. 2. As shown in FIG. 5, the transistor 500 is formed over the substrate 502. The substrate 502 may include silicon (Si). The substrate 502 may be a P substrate, a N substrate, or undoped. The transistor 500 includes a source 504, a drain 506, a gate 508, and a plurality of channels 510 (e.g., 510a, 510b, 510c). In some implementations, the substrate 502 may be considered part of the transistor 500. Although not shown, the substrate 502 may include wells, such as a P-well and an N-well.

FIG. 5 illustrates the source 504 is disposed (e.g., formed, located) over the substrate 502. Similarly, the drain 506 is disposed (e.g., formed, located) over the substrate 502. The plurality of channels 510 is coupled to the source 504 and the drain 506. The plurality of channels 510 is located between the source 504 and the drain 506. The plurality of channels 510 is configured to allow a current to flow between the source 504 and the drain 506 when a voltage (Vt) is applied between the gate 508 and the substrate 502. The plurality of channels 510 may include a first channel 510a, a second channel 510b and a third channel 510c. The first channel 510a, the second channel 510b and the third channel 510c may be stacked vertically above one another, with a space (for a gate) between each channel. Different implementations may include a different number of channels 510.

One or more of the channels from the plurality of channels 510 may include silicon germanium (SiGe). In some implementations, one or more channels may include silicon (Si) with a concentration of germanium (Ge) in a range of approximately 2-8 percent (%). In some implementations, each channel from the first plurality of channels 510 has a channel thickness of approximately 5-10 nanometers (nm). In some implementations, the vertical space or gap between channels is approximately 7-20 nanometers (nm).

The gate 508 is located between the source 504 and the drain 506. The gate 508 is formed such as to wrap around or surround the plurality of channels 510. For example, the gate 508 may surround the four sides of a channel from the plurality of channels 510. The transistor 500 also includes a spacer 516 and an inner spacer 518. The spacer 516 and/or the inner spacer 518 may include SiO, SiN, SiON, SiC, and/or combinations thereof.

FIG. 5 illustrates that there is one or more layers between the gate 508 and the plurality of channels 510 (e.g., 510a, 510b, 510c). For example, there may be a first layer 511, a second layer 513 and/or a third layer 515, between the gate 508 and the plurality of channels 510 (e.g., 510a, 510b, 510c). The thickness of the various layers (e.g., 511, 513, 515) may vary. The first layer 511 may be disposed over the plurality channels 510. The second layer 513 may be disposed over the first layer 511. The third layer 515 may be disposed over the second layer 513. The first layer 511 may include a high K dielectric layer. The high K dielectric layer may include HfO, HfSiO, HfSiON, HfLaO, HfLaSiO, HfLaSiON, HfAlO, HfAlSiO, HfAlSiON, and/or combinations thereof. The second layer 513 may include a first metal layer (e.g., titanium nitride (Tin)). The third layer 515 may be a work function metal layer (e.g., TiAlxCy). The work function metal layer may include TiN, TaN, TiAl(C), TiAlxCy, W, and/or combinations thereof. The gate 508 may include a low resistive metal (e.g., Tungsten). As mentioned above, the first layer 511, the second layer 513, and the third layer 517 may be considered part of the gate.

Figure 6:
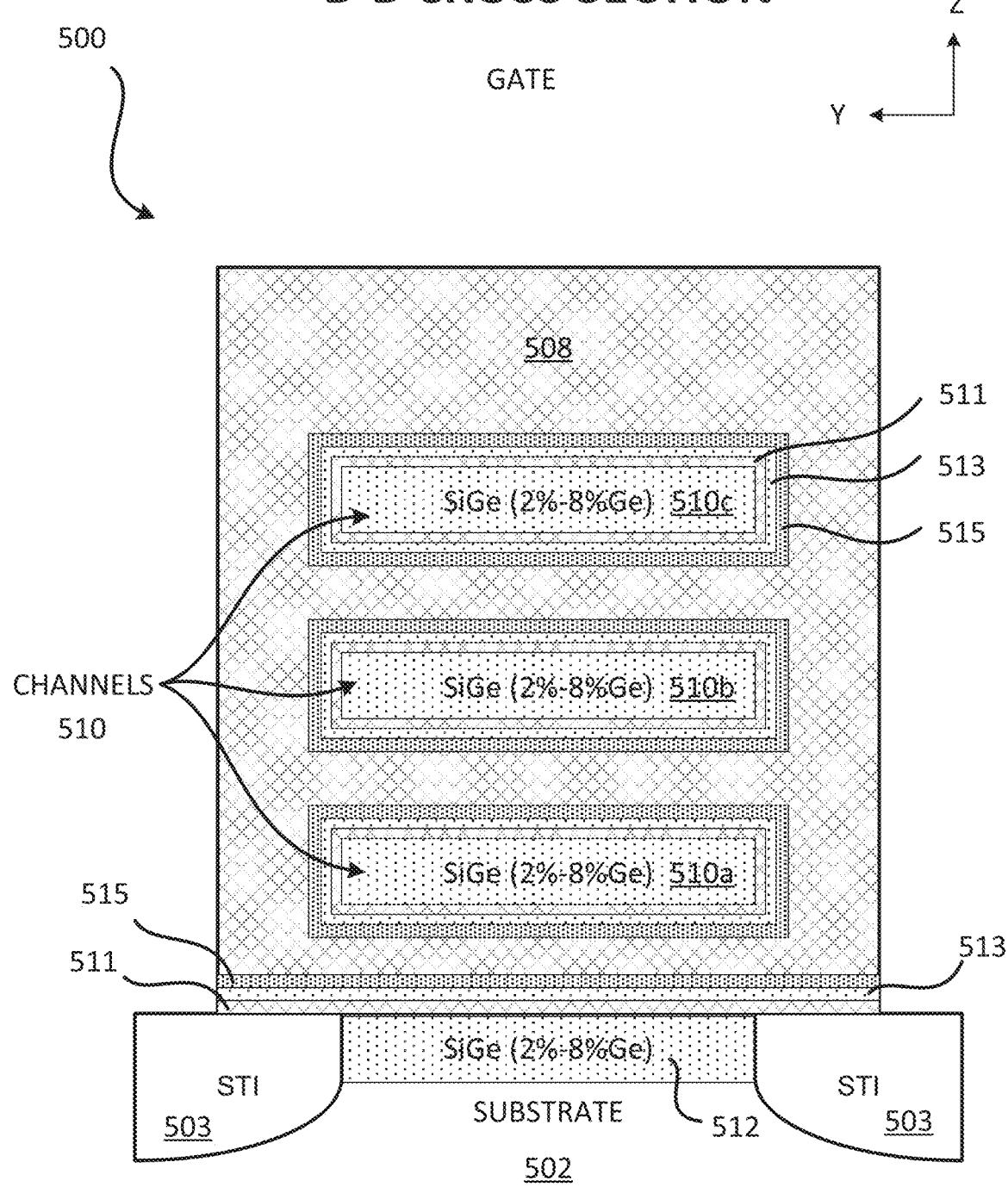
FIG. 6 illustrates an exemplary view of a second cross section of a gate-all-around FET.

FIG. 6 illustrates another profile view of the transistor 500. The transistor 500 of FIG. 6, may represent a view across a cross section BB of the transistor 200 of FIG. 2. FIG. 6 illustrates that there is one or more layers between the gate 508 and the substrate 502. In particular, there is the first layer 511, the second layer 513 and the third layer 515, between the gate 508 and the substrate 502. The first layer 511 may be located over the substrate 502 (e.g., over the STI 503). The second layer 513 may be located over the first layer 511. The third layer 515 may be located over the second layer 513. The gate 508 may be located over the third layer 515.

FIGS. 5 and 6 illustrate a bottom SiGe layer 512. In some implementations, the bottom SiGe layer 512 may be considered part of the plurality of channels 510, depending on whether the bottom SiGe layer 512 is coupled to the source 504 and the drain 506. The bottom SiGe layer 512 may be considered part of the substrate 502 or the bottom SiGe layer 512 may be considered to be located over the substrate 502. It is noted that the size and shape of the transistor 500 is exemplary. Moreover, some or all of the components of the transistor 500 shown may not be to scale. In addition, the position and/or location of the various components of the transistor 500 may vary.

As mentioned above, a transistor may be configured to operate as a NMOS transistor or a PMOS transistor. FIGS. 7-12 illustrate examples of a NMOS transistor and a PMOS transistor. In some implementations, the variations in thicknesses of the various layers (e.g., 311, 313, 315) may vary based on whether the transistor is configured to operate as a NMOS transistor or a PMOS transistor.

Figure 7:
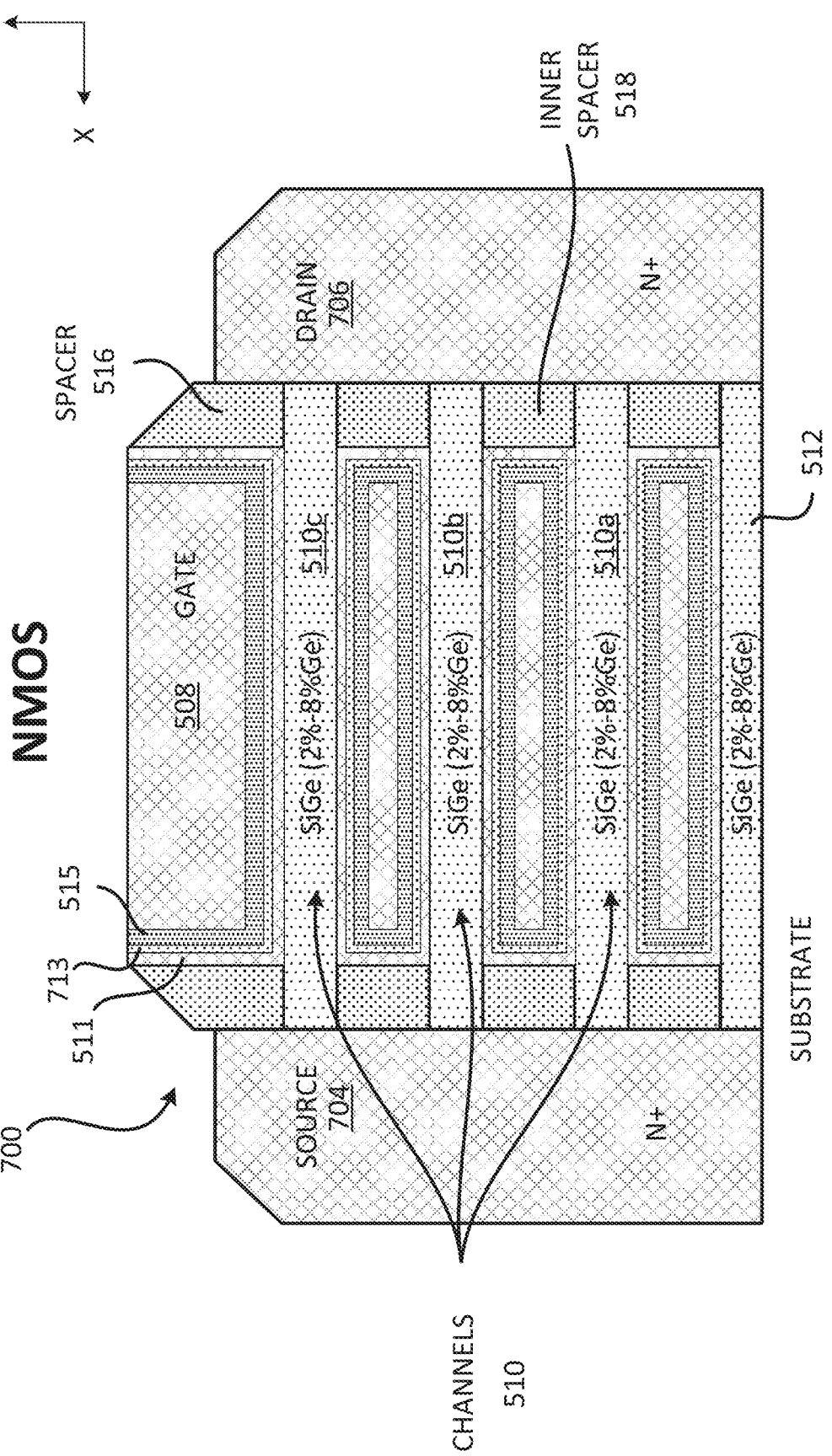
FIG. 7 illustrates an exemplary view of a first cross section of a gate-all-around FET configured as a NMOS transistor.

FIG. 7 illustrates an exemplary profile view of a transistor 700. The transistor 700 of FIG. 7, may represent a view across a cross section AA of the transistor 200 of FIG. 2. The transistor 700 may be similar to the transistor 500 of FIG. 5, and thus includes the same or similar components as the transistor 500. The transistor 700 is configured to operate as a negative channel metal oxide semiconductor (NMOS) transistor. FIG. 7 illustrates that the transistor 700 includes a source 704 and a drain 706. The source 704 is similar to the source 504. The drain 706 is similar to the drain 506. The source 704 and the drain 706 each includes an N type dopant (N+). Although not shown, the transistor 700 may be formed over a P-well or a N well of the substrate 502. The substrate 502 may be a P substrate or a N substrate. As shown in FIG. 7, the transistor 700 includes the layer 511, the second layer 713 and the third layer 515. The second layer 713 is similar to the second layer 513 as described in FIG. 5, except that the second layer 713 is thinner. In some implementations, the second layer 713 has a thickness of approximately 1-3 nanometers (nm).

Figure 8:
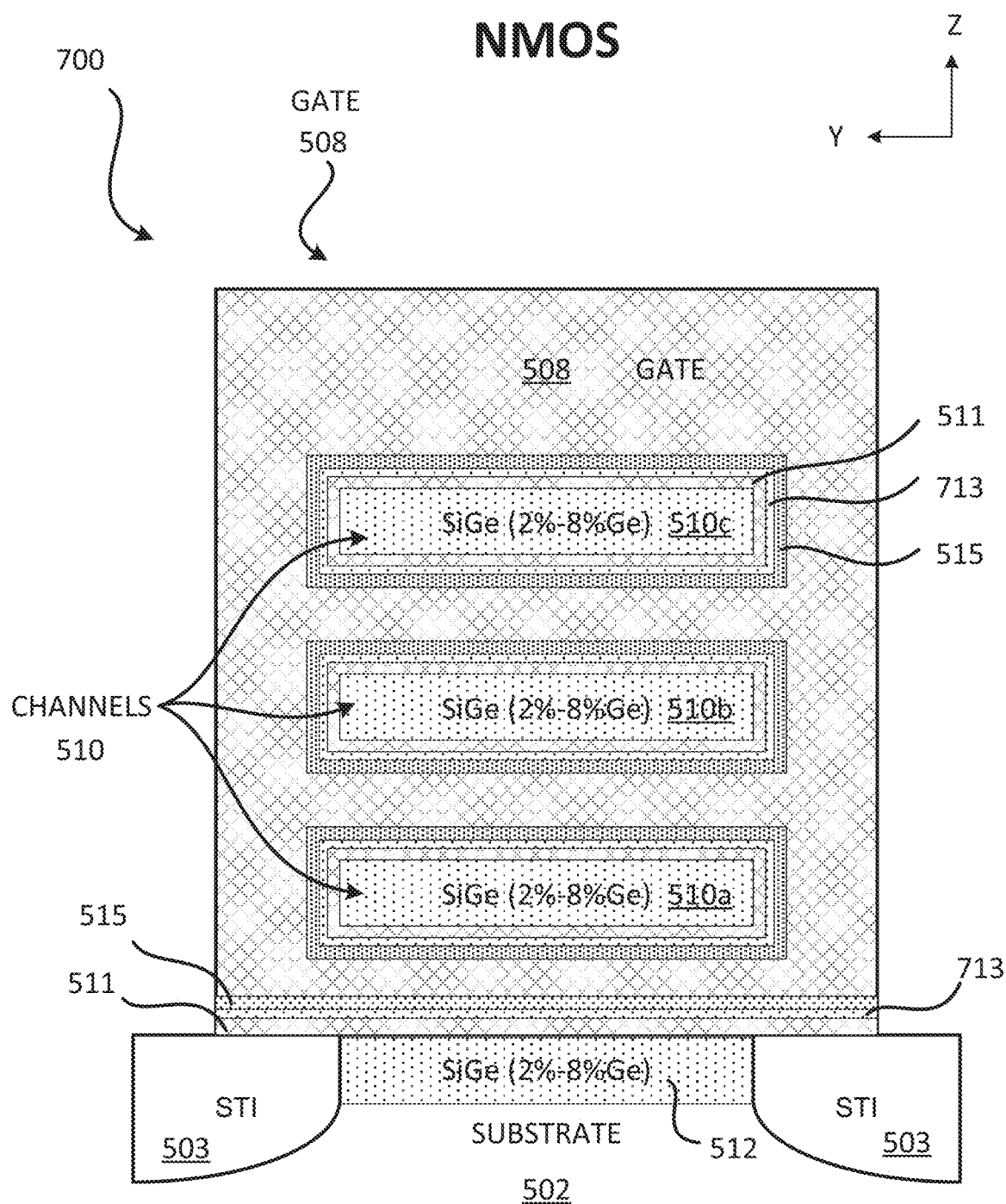
FIG. 8 illustrates an exemplary view of a second cross section of a gate-all-around FET configured as a NMOS transistor.

FIG. 8 illustrates an exemplary profile view of the transistor 700. The transistor 700 of FIG. 8, may represent a view across a cross section BB of the transistor 200 of FIG. 2. The transistor 700 may be similar to the transistor 500 of FIG. 6, and thus includes the same or similar components as the transistor 500. As shown in FIG. 8, the transistor 700 includes the layer 511, the second layer 713 and the third layer 515. The second layer 713 is similar to the second layer 513 as described in FIG. 5, except that the second layer 713 is thinner.

Figure 9:
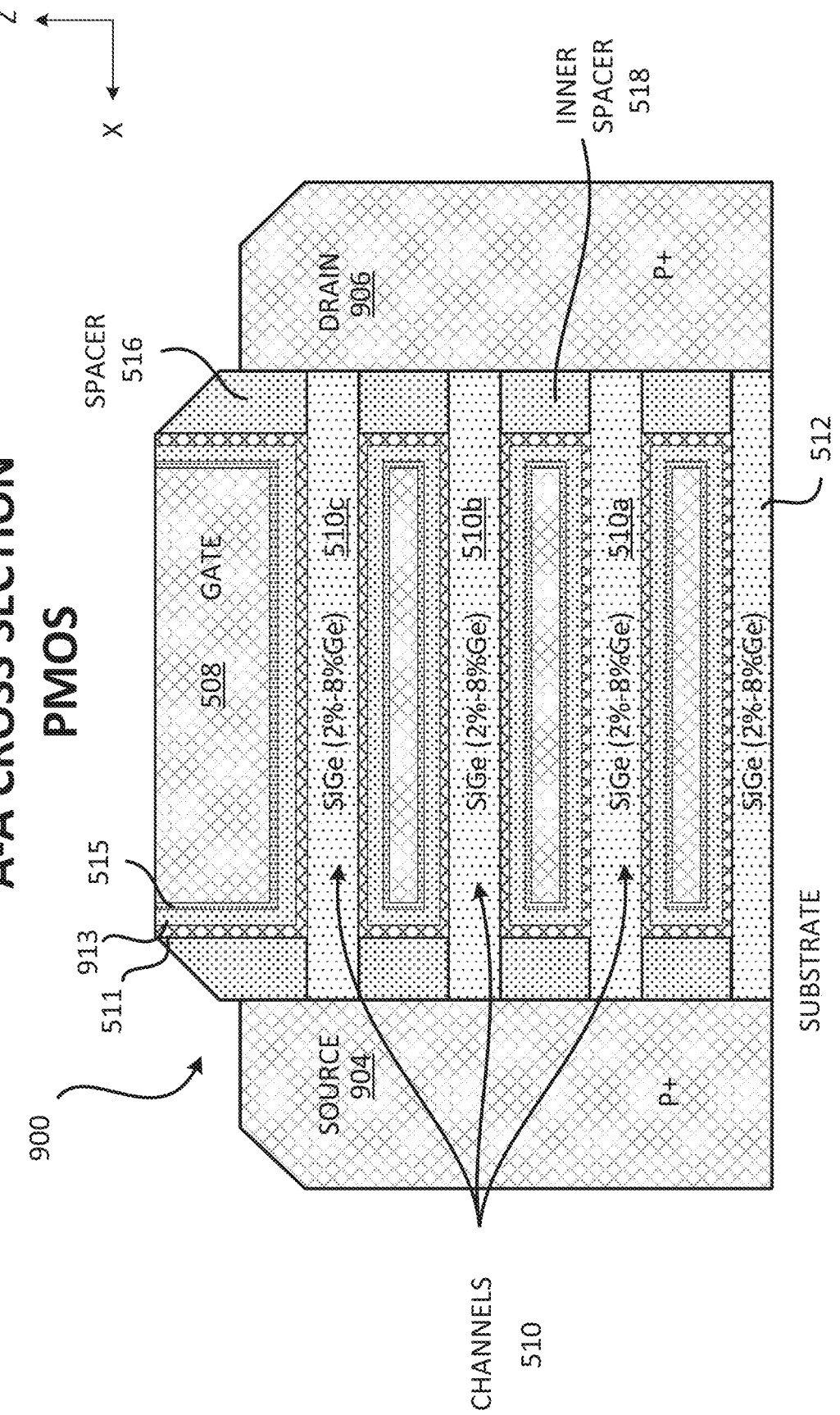
FIG. 9 illustrates an exemplary view of a first cross section of a gate-all-around FET configured as a PMOS transistor.

FIG. 9 illustrates an exemplary profile view of a transistor 900. The transistor 900 of FIG. 9, may represent a view across a cross section AA of the transistor 200 of FIG. 2. The transistor 900 may be similar to the transistor 500 of FIG. 5, and thus includes the same or similar components as the transistor 500. The transistor 900 is configured to operate as a positive channel metal oxide semiconductor (PMOS) transistor. FIG. 9 illustrates that the transistor 900 includes a source 904 and a drain 906. The source 904 is similar to the source 504. The drain 906 is similar to the drain 506. The source 904 and the drain 906 each includes a P type dopant (P+). Although not shown, the transistor 900 may be formed over a N-well or a P-well of the substrate 502. The substrate 502 may be a P substrate or a N substrate. As shown in FIG. 9, the transistor 900 includes the layer 511, a second layer 913 and the third layer 515. The second layer 913 is similar to the second layer 513 as described in FIG. 5, except that the second layer 913 is thicker. In some implementations, the second layer 913 has a thickness of approximately 2-4 nanometers (nm).

Figure 10:
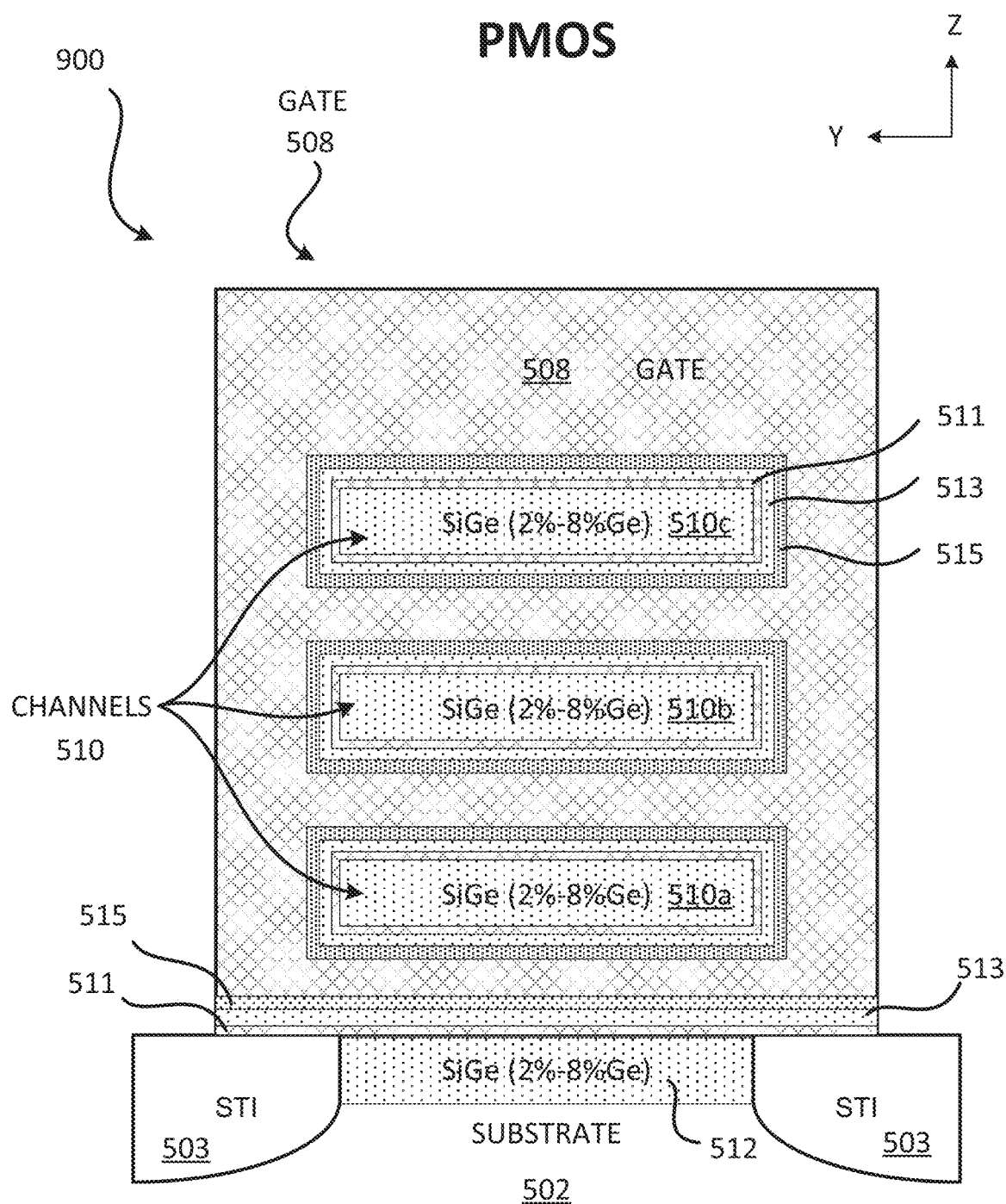
FIG. 10 illustrates an exemplary view of a second cross section of a gate-all-around FET configured as a PMOS transistor.

FIG. 10 illustrates an exemplary profile view of the transistor 900. The transistor 900 of FIG. 10, may represent a view across a cross section BB of the transistor 200 of FIG. 2. The transistor 900 may be similar to the transistor 500 of FIG. 6, and thus includes the same or similar components as the transistor 500. As shown in FIG. 10, the transistor 900 includes the layer 511, the second layer 913 and the third layer 515. The second layer 913 is similar to the second layer 513 as described in FIG. 5, except that the second layer 913 is thicker.

Figure 11:
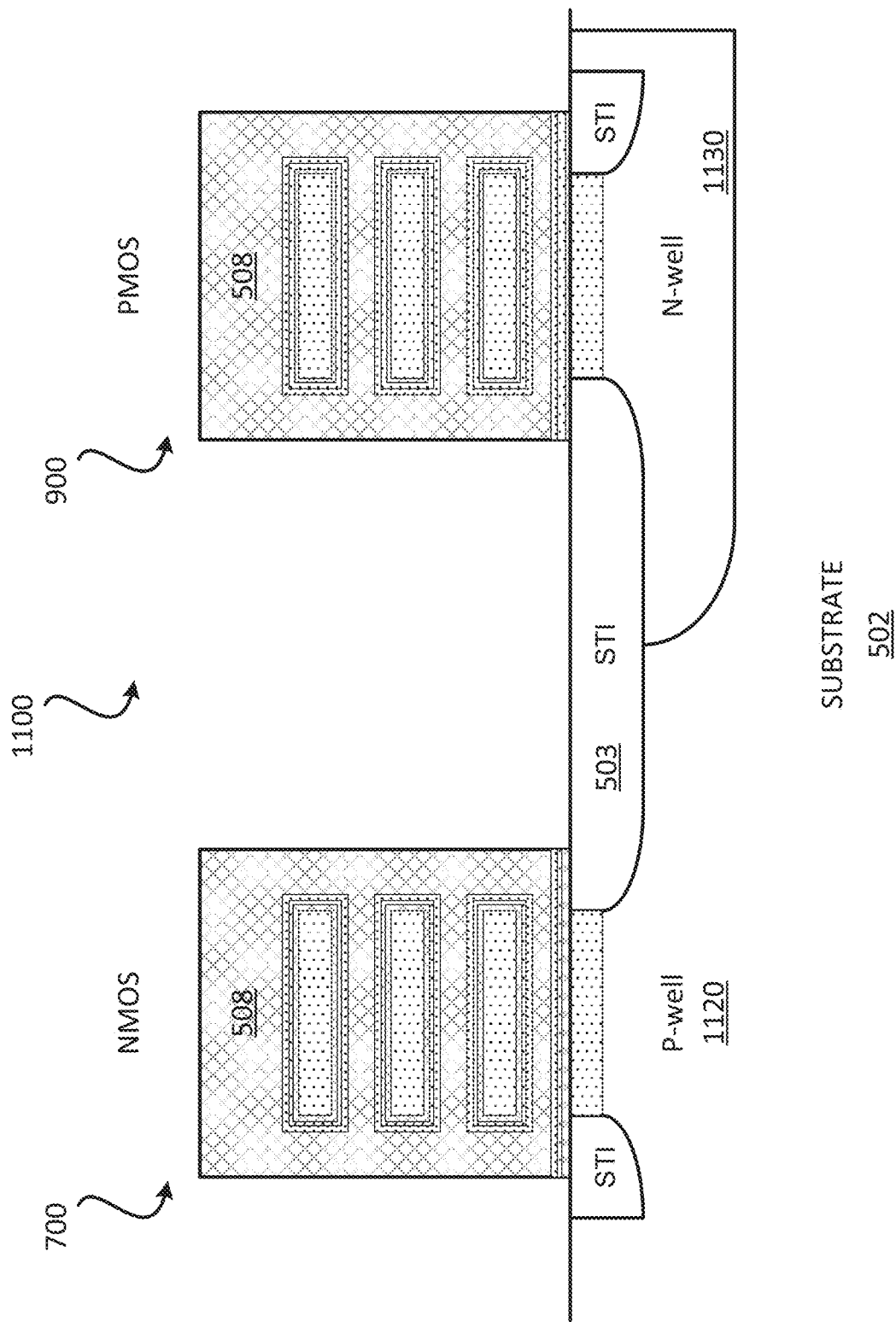
FIG. 11 illustrates a structure that includes a PMOS transistor and a NMOS transistor.

In some implementations, a NMOS transistor and a PMOS transistor may be formed to operate as a complementary metal-oxide-semiconductor (CMOS). FIG. 11 illustrates a first structure 1100 formed over the substrate 502. The first structure 1100 includes the transistor 700 and the transistor 900. The transistor 700 may be a first transistor configured to operate as a NMOS, and the transistor 900 may be a second transistor configured to operate as a PMOS. The transistor 700 is formed over the P-well 1120, while the transistor 900 is formed over the N-well 1130. Both the transistor 700 and the transistor 900 includes their own respective gate 508 (e.g., first gate for the transistor 700, second gate for the transistor 900). In some implementations, the first structure 1100 may be configured to operate as a complementary metal-oxide-semiconductor (CMOS) structure. The P-well 1120 may represent the substrate 502. For example, the substrate 502 may be a P substrate (substrate that is doped of P type dopant). Alternatively, the substrate 502 may be a N substrate (substrate that is doped with a N type dopant), and a P well is formed in the N substrate 502.

Figure 12:
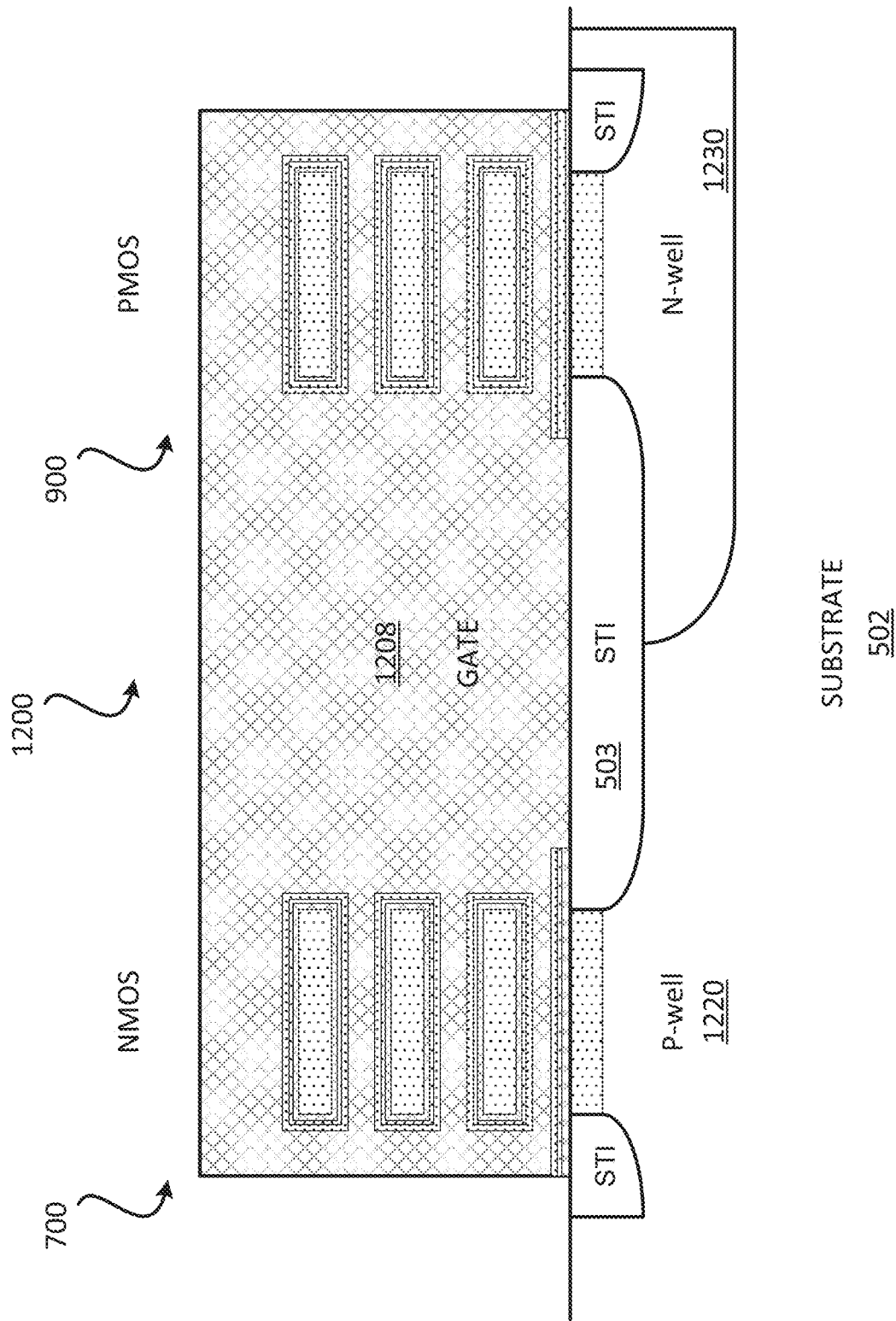
FIG. 12 illustrates another structure that includes a PMOS transistor and a NMOS transistor.

FIG. 12 illustrates another implementation of a CMOS. FIG. 12 illustrates a second structure 1200 formed over the substrate 502. The second structure 1200 includes the transistor 700 and the transistor 900. The transistor 700 may be a first transistor configured to operate as a NMOS, and the transistor 900 may be a second transistor configured to operate as a PMOS. The transistor 700 is formed over the P-well 1220, while the transistor 900 is formed over the N-well 1230. The P-well 1220 may represent the substrate 502. For example, the substrate 502 may be a P substrate (substrate that is doped of P type dopant). Alternatively, the substrate 502 may be a N substrate (substrate that is doped with a N type dopant), and a P well is formed in the n substrate 502.

As shown in FIG. 12, the transistor 700 and the transistor 900 share the same gate 1208. Thus, for example, the transistor 700 may include a first gate, and the transistor 900 may include a second gate, where the first gate and the second gate are part of the same gate 1208. In some implementations, the second structure 1200 may be configured to operate as a complementary metal-oxide-semiconductor (CMOS) structure. It is noted that in this example, a voltage (that is high enough) applied to the gate 1208 may induce a current flow in both the transistor 700 and the transistor 900 of the second structure 1200. In this example, the lowest possible voltage that is applied to the gate 1208 must be high enough to meet the minimum voltage requirement of both transistors (700, 900). Thus, if one transistor has a different minimum voltage requirement to induce a current flow than the other transistor, the higher minimum voltage requirement will be used. In some implementations, the use of silicon germanium (SiGe) in the channels of the transistors allows both NMOS transistors and PMOS transistors to have lower minimum voltage requirements to induce a current flow.

Having described various transistors, including a NMOS transistor and a PMOS transistor, a sequence for fabricating one or more transistors will now be described below.

Exemplary Sequence for Fabricating a Transistor that Includes Channels with Silicon Germanium (SiGe)

In some implementations, fabricating a transistor, such as a NMOS transistor or a PMOS transistor, includes several processes. FIG. 13 (which includes FIGS. 13A-13H) illustrates an exemplary sequence for providing or fabricating a transistor. In some implementations, the sequence of FIGS. 13A-13H may be used to provide or fabricate the transistor of FIGS. 2, 3, 5-12 and/or other transistors described in the present disclosure. It is noted that the sequence for fabricating the transistor may be used to provide or fabricate a CMOS structure having a NMOS transistor and a PMOS transistor. In addition, the sequence for fabricating the transistor may be used to fabricate several transistors (e.g., NMOS transistor, PMOS transistor) at the same time. However, for the purpose of clarity, the sequence of FIG. 13 illustrates the fabrication of one transistor.

It should be noted that the sequence of FIGS. 13A-13H may combine one or more stages in order to simplify and/or clarify the sequence for providing or fabricating a transistor. In some implementations, the order of the processes may be changed or modified. In some implementations, one or more of processes may be replaced or substituted without departing from the spirit of the disclosure.

Figure 13A:
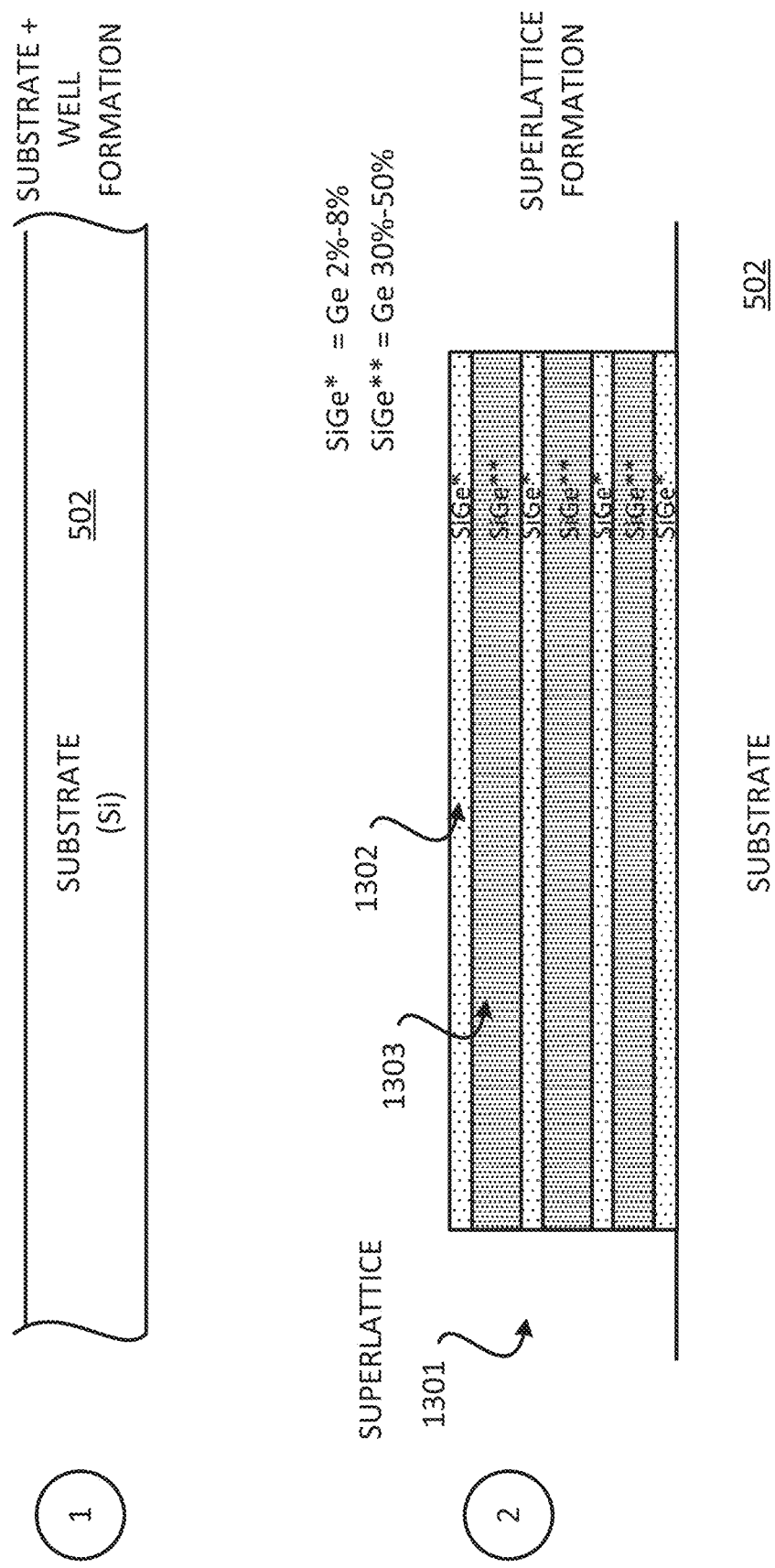
FIG. 13 (comprising FIGS. 13A-13H) illustrates an exemplary sequence for fabricating a gate-all-around FET.

Stage 1, as shown in FIG. 13A, illustrates a state after a substrate 502 is provided. Different implementations may provide different materials for the substrate 502. In some implementations, the substrate 502 may include silicon (Si). Stage 1 may also illustrate a state after one or more wells (e.g., P-well, N-well) are formed in the substrate 502. Well formation may include ion formation or a diffusion process. In some implementations, the substrate 502 may already include dopant. For example, if the substrate 502 is a P substrate, then a N well may be formed in the substrate 502. If the substrate 502 is a N substrate, then a P well may be formed in the substrate 502. In some implementations, oxidation, photoresist, masking, photoresist removal, etching (e.g., acid etching), and well formation may be used to provide the substrate 502. For the purpose of clarity, wells are not shown.

Stage 2 illustrates a state after superlattice formation. In some implementations, superlattice formation includes forming a stacked structure of alternating layers of low silicon germanium (SiGe) layer 1302 and high silicon germanium (SiGe) layer 1303 over the substrate 502 and creating one or more superlattices 1301 from the stacked structure by removing (e.g., etching, dry etching, wet etching) portions of the stacked structure. The low silicon germanium (SiGe) layer 1302 may be represented as SiGe* in the figures. The low SiGe layer 1302 may include germanium with a concentration in a range of approximately 2%-8%. The high silicon germanium (SiGe) layer 1303 may be represented as SiGe** in the figures. The high SiGe layer 1303 may include germanium with a concentration in a range of approximately 30%-50%. However, different implementations may use different concentrations of Ge for the low SiGe layer 1302 and/or the high SiGe layer 1303.

The process of forming a stacked structure may include using an epitaxial process. The process of fabricating superlattices may include fabricating one or more shallow trench isolation (STI) (which are not shown). Superlattice formation may also include a fin reveal process where portions of the STI are removed, exposing at least some portions of the superlattice and/or fin.

Figure 13B:
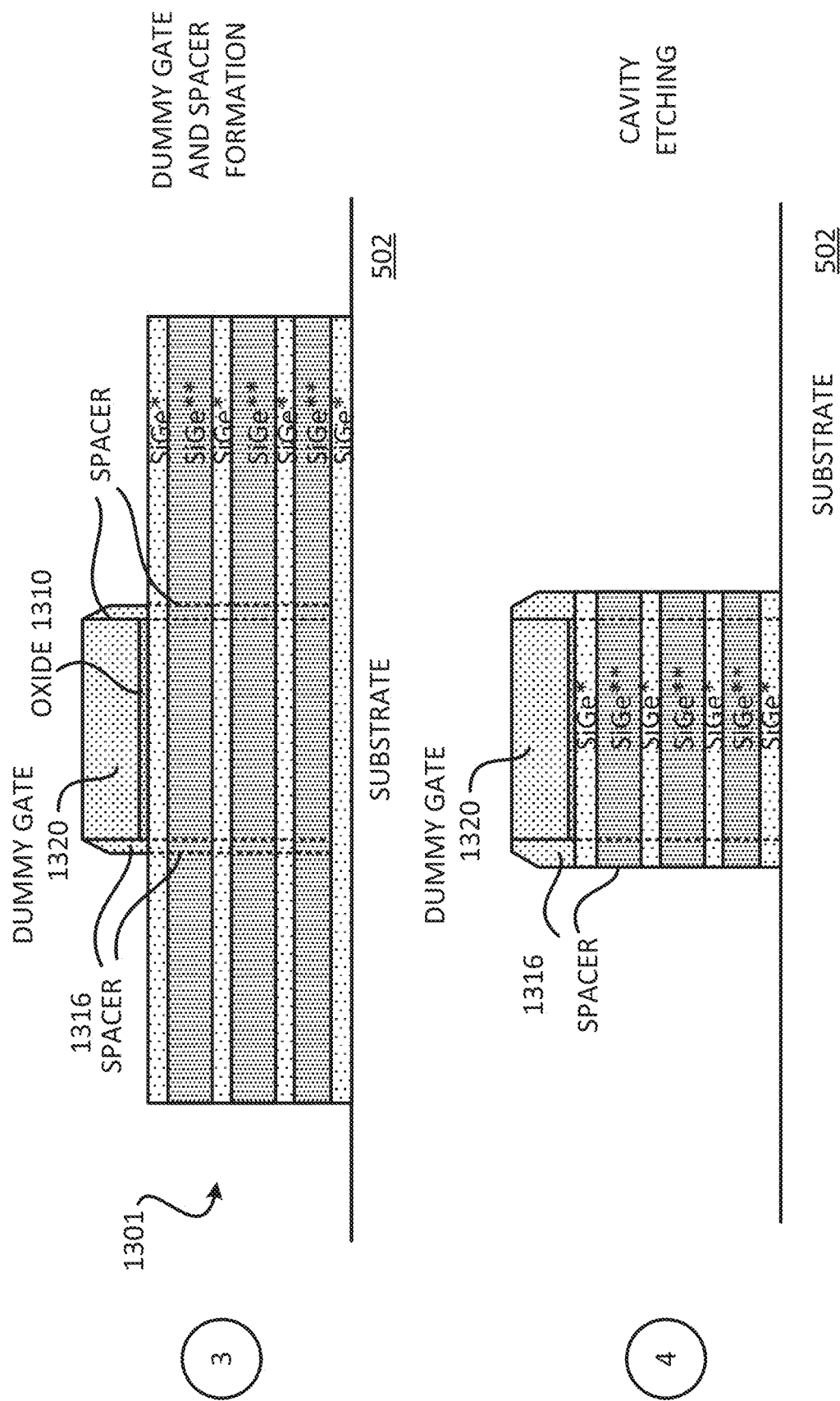

Stage 3, as shown in FIG. 13B, illustrates a state after dummy gate and spacer formation. An oxide layer 1310 is formed over the superlattice 1301 (e.g., over a top low SiGe layer). A dummy gate 1320 is formed over the oxide layer 1310 and the superlattice 1301. In addition, spacers 1316 are formed over the superlattice 1301. More specifically, spacers 1316 are formed over the superlattice 1301 and next to (and on each side of) the dummy gate 1320. It is noted that the spacer 1316 is exemplary. In some implementations, the spacer 1316 may be the spacer 516, or any of the spacers described in the disclosure. A chemical vapor deposition (CVD) process and/or an atomic layer deposition (ALD) process may be used to form the dummy gate and/or the spacer.

Stage 4 illustrates a state after cavity etching. After cavity etching, portions of the superlattice 1301 not covered by the dummy gate 1320 and/or the spacer 1316 are removed. Cavity etching may involve removing portions of the low SiGe layer 1302 and portions the high SiGe layer 1303 of the superlattice 1301.

Figure 13C:
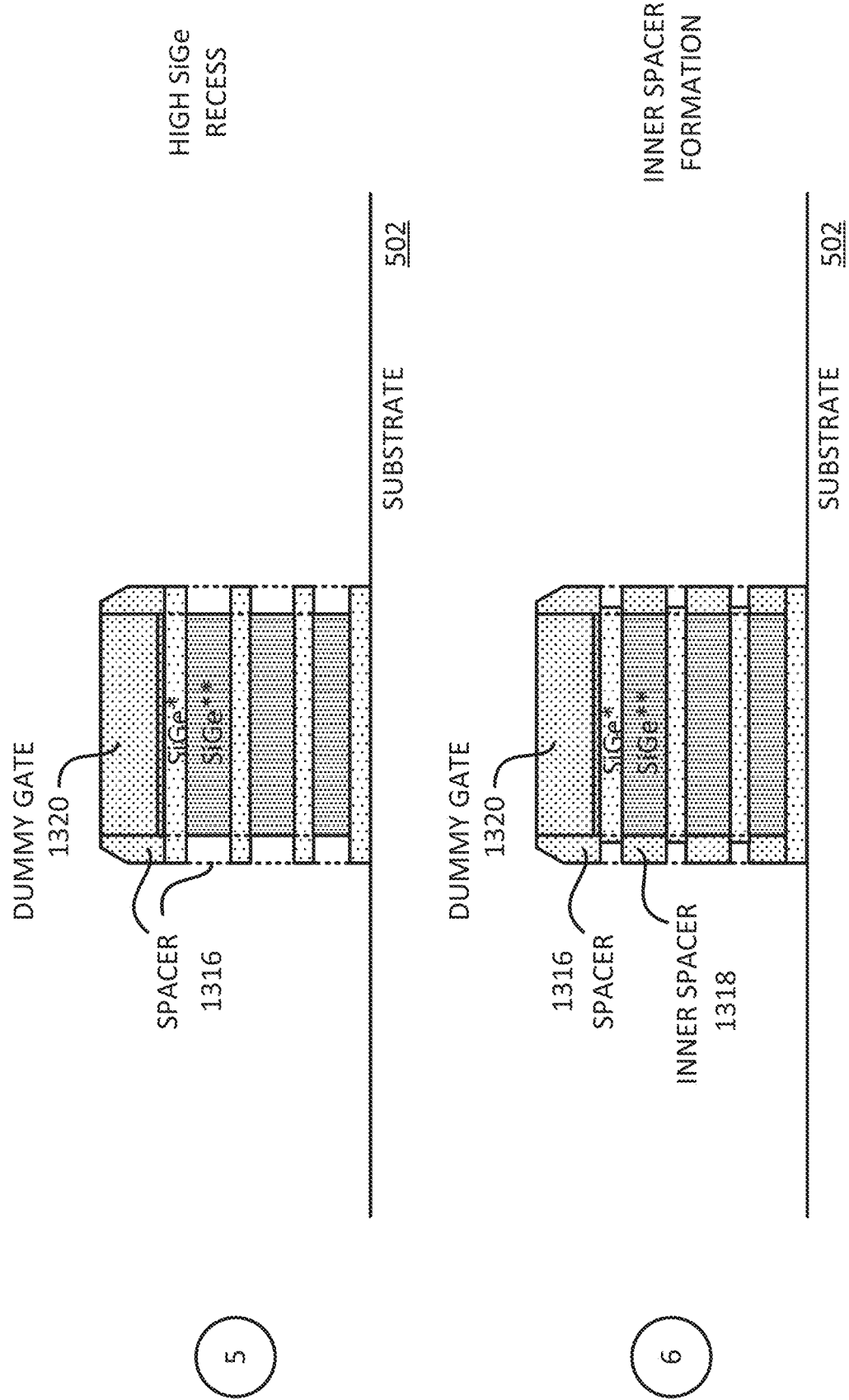

Stage 5, as shown in FIG. 13C, illustrates a state after SiGe recess. After SiGe recess, portions of the high SiGe layer 1303 underneath the spacer 1316 are removed.

Stage 6 illustrates a state after inner spacer formation. After inner spacer formation, inner spacers 1318 are formed in the cavity where the high SiGe layer 1303 was previously removed (as shown in stage 5). In some implementations, the inner spacer 1318 may be the inner spacer 518, or any of the spacers described in the disclosure.

Figure 13D:
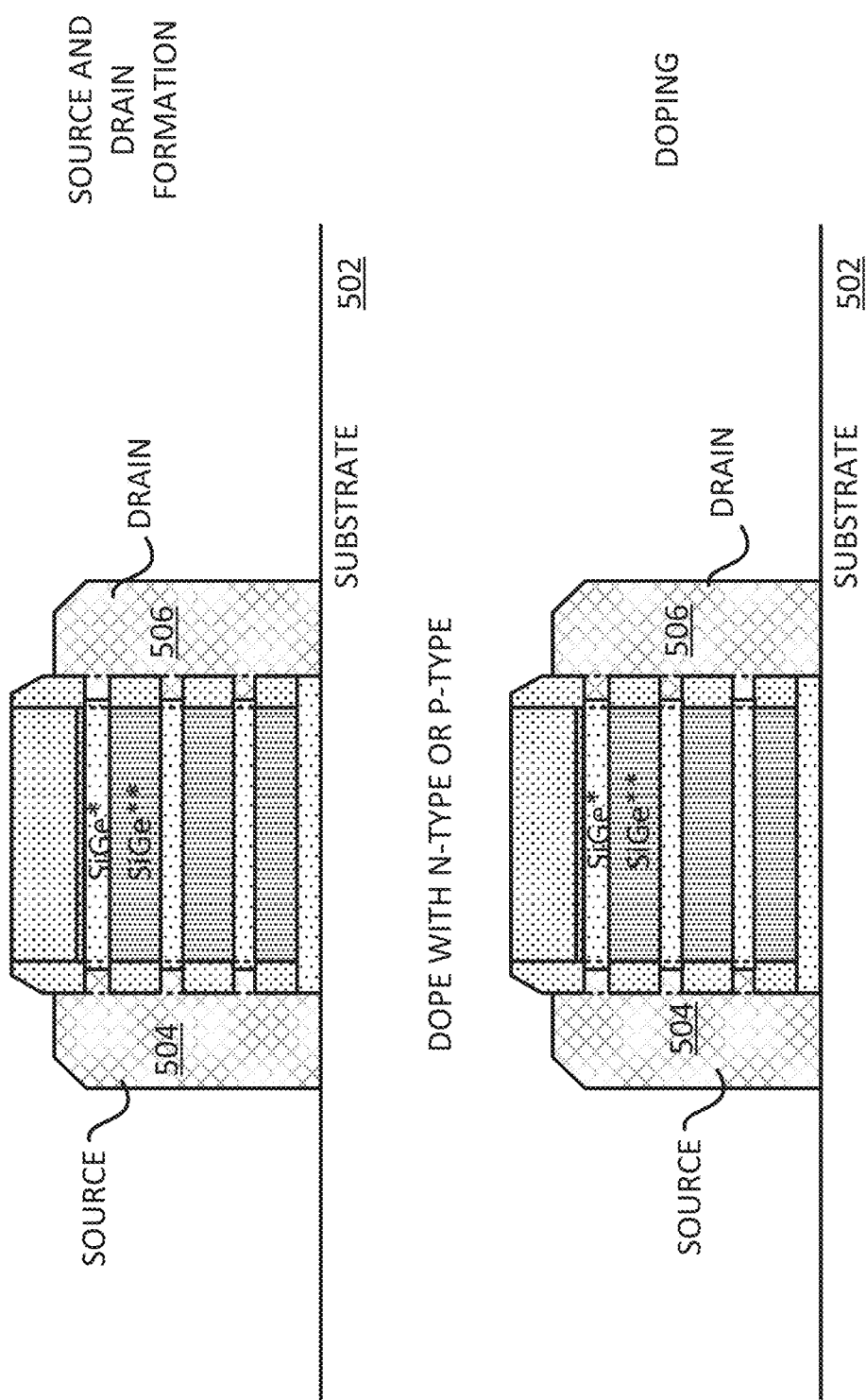

Stage 7, as shown in FIG. 13D, illustrates a state after source and drain formation. After source and drain formation, a source and a drain are formed over the substrate 502. For example, a first source 504 and a first drain 506 are disposed over the substrate 502.

Stage 8, illustrates a state after doping of the source and drain. The source 504 and the drain 506 may be doped with either an N type dopant (N+) or a P type dopant (P+). Doping the source 504 and the drain 506 with a N type dopant (N+) may produce the source 704 and the drain 706 of FIG. 7. Doping the source 504 and the drain 506 with a P type dopant (P+) may produce the source 904 and the drain 906. Vapor phase epitaxy may be used to dope the source and the drain. However, different implementations may use different processes for doping the source and the drain.

Figure 13E:
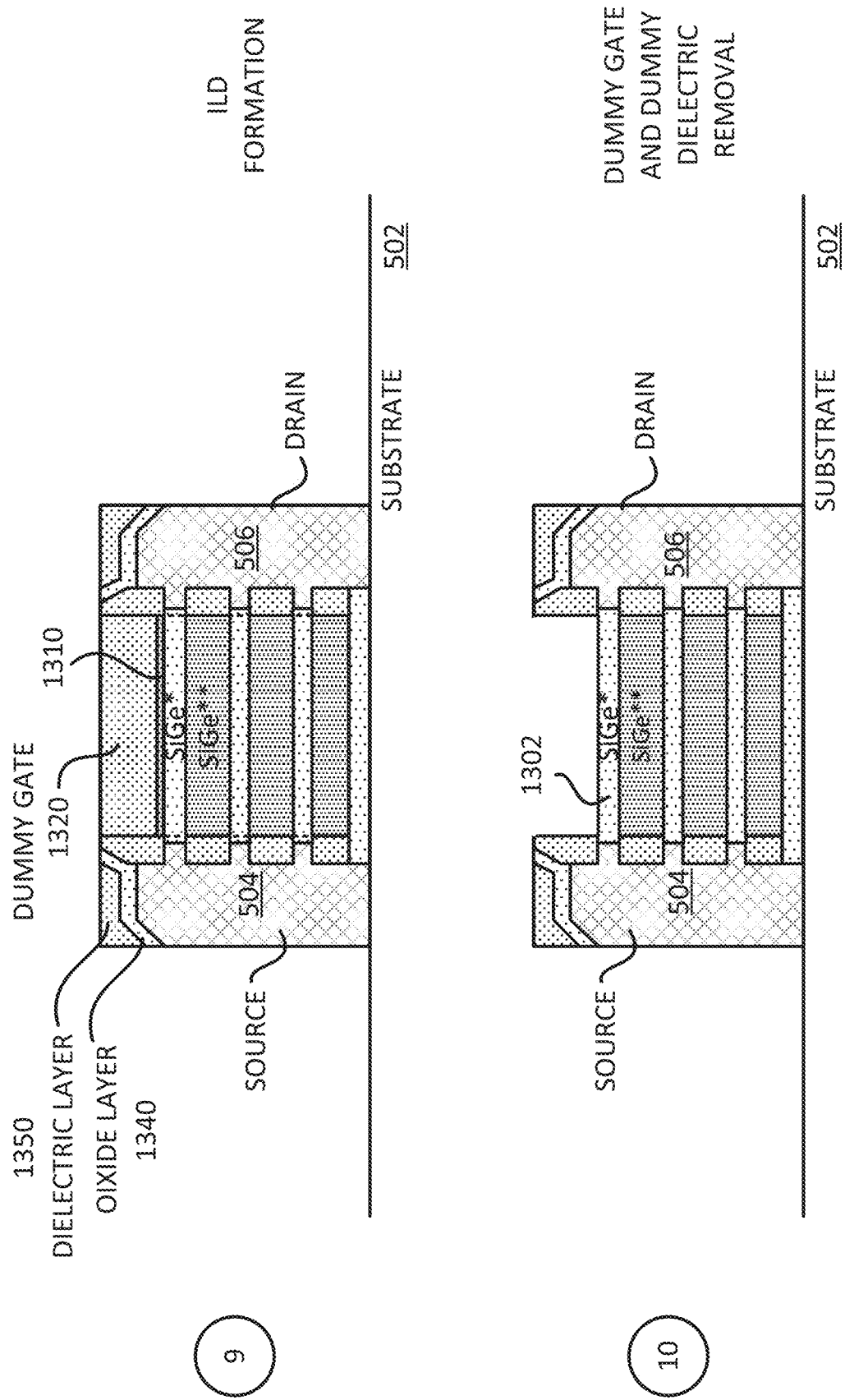

Stage 9, as shown in FIG. 13E, illustrates a state after interlevel dielectric (ILD) formation. After ILD formation, an oxide layer 1340 is formed over the source 304, the drain 306 and the spacer 1316. A dielectric layer 1350 is further formed over the oxide layer 1340.

Stage 10 illustrates a state after dummy gate and dummy dielectric layer removal, where the dummy gate 1320 and the oxide layer 1310 are removed, exposing portions of the top low SiGe layer 1302.

Figure 13F:
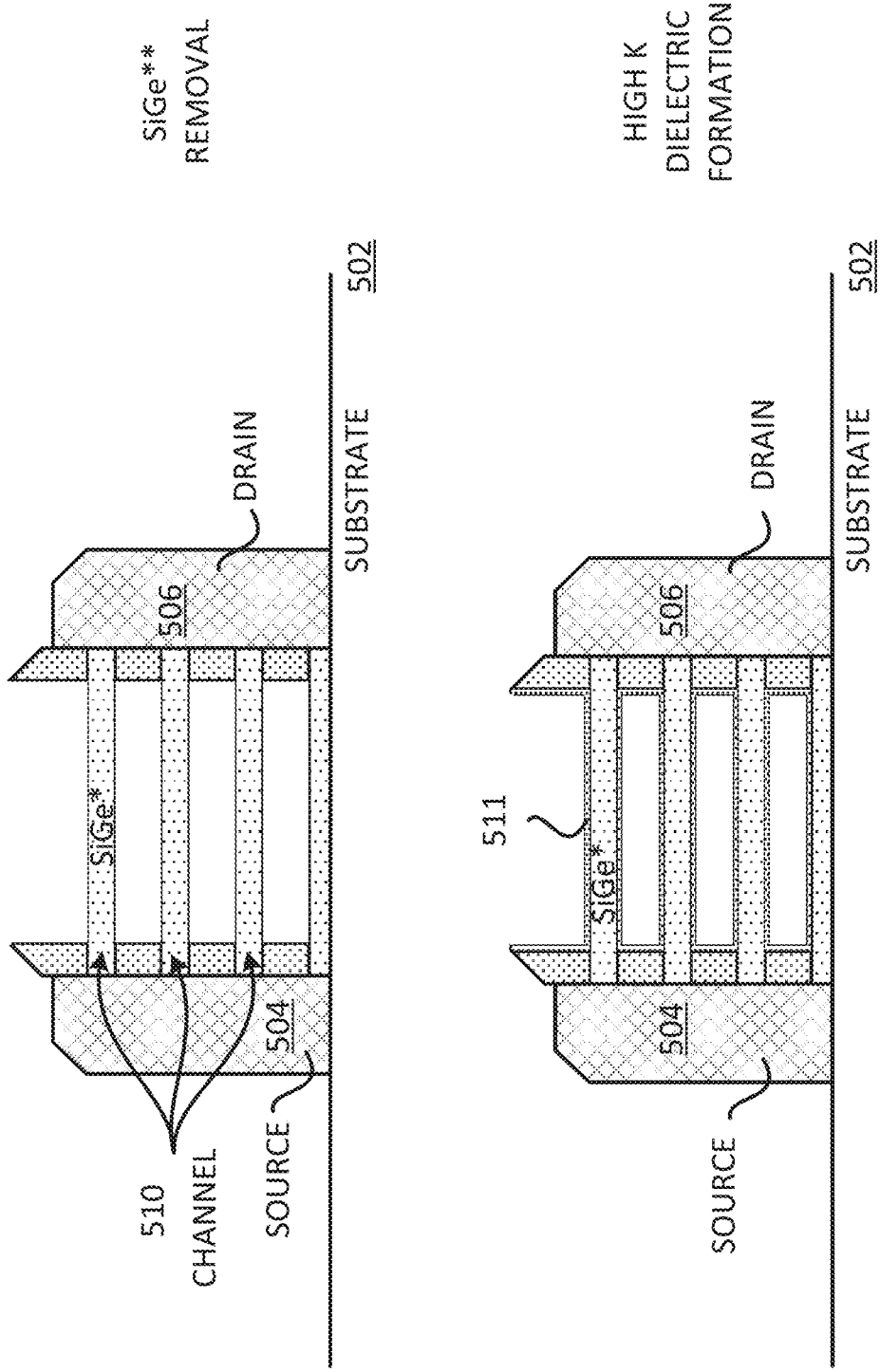

Stage 11, as shown in FIG. 13F, illustrates a state after high SiGe layers removal, where the high SiGe layers 1303 of the superlattice 1301 are removed (e.g., etched), leaving cavities between the low SiGe layers 1302.

Stage 12 illustrates a state after high K dielectric layer formation, where a high K dielectric layer is formed between the spacer 1316 in the cavity that was previously occupied by the high SiGe layers 1303. The high K dielectric layer may be the first layer 511, as described in FIG. 5. A deposition process may be used to form the high K dielectric layer. However, different implementations may form the high K dielectric layer differently. For purpose of clarity, the oxide layer 1340 and the dielectric layer 1350 are not shown.

Figure 13G:
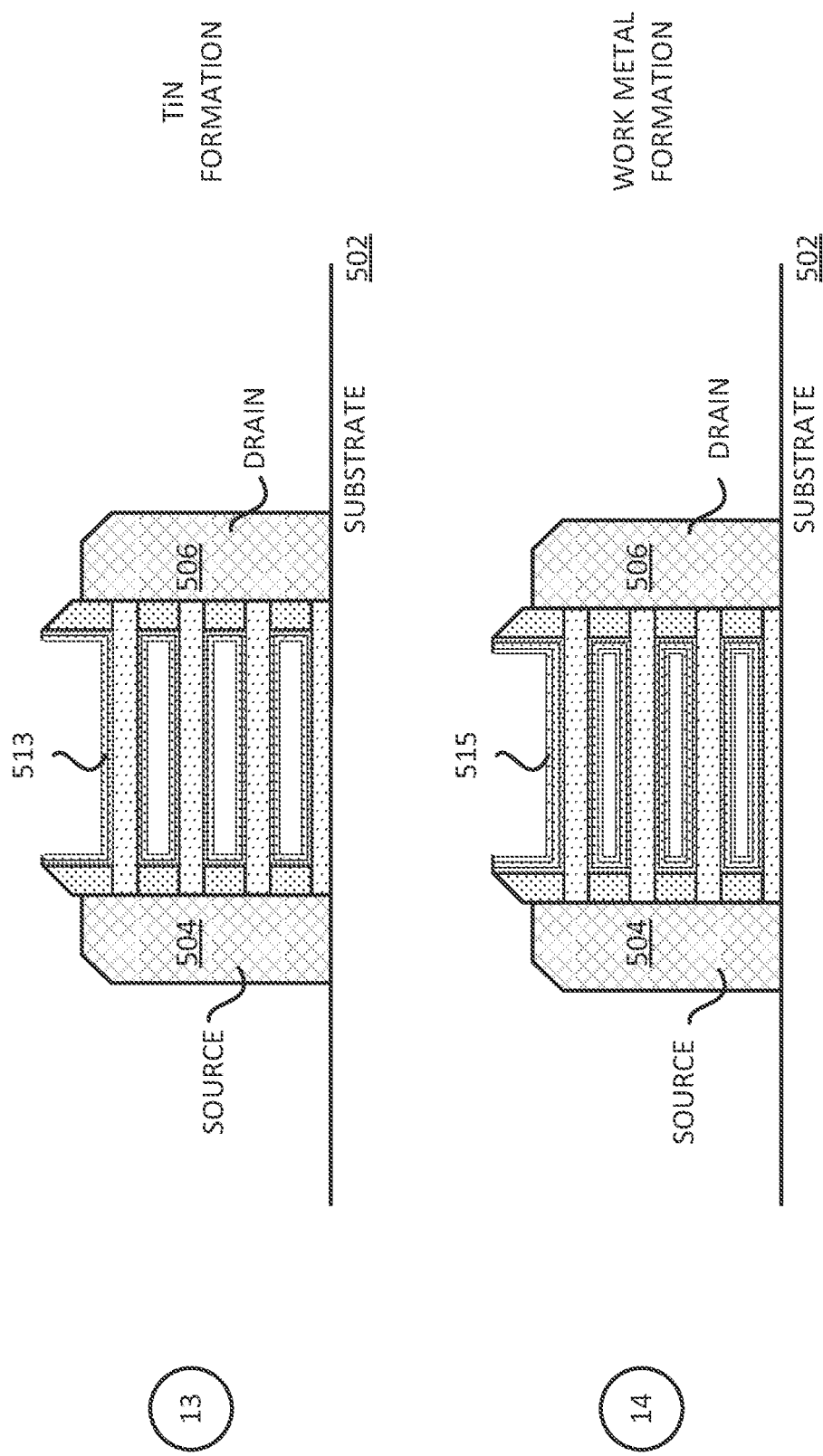

Stage 13, as shown in FIG. 13G, illustrates a state after a second layer formation, where a second layer 513 is formed over the high K dielectric layer. The second layer 513 may include TiN, or any of the other materials described in the disclosure. A deposition process may be used to form the second layer 513. However, different implementations may form the second layer differently.

Stage 14 illustrates a state after a work metal formation, where a third layer 515 is formed over the second layer 513. The third layer 515 may include a metal. Examples of the third layer 515 includes TaN, TiAl(C), TiAlxCy, W, and/or combinations thereof. A deposition process may be used to form the third layer 515. However, different implementations may form the third layer differently.

Figure 13H:
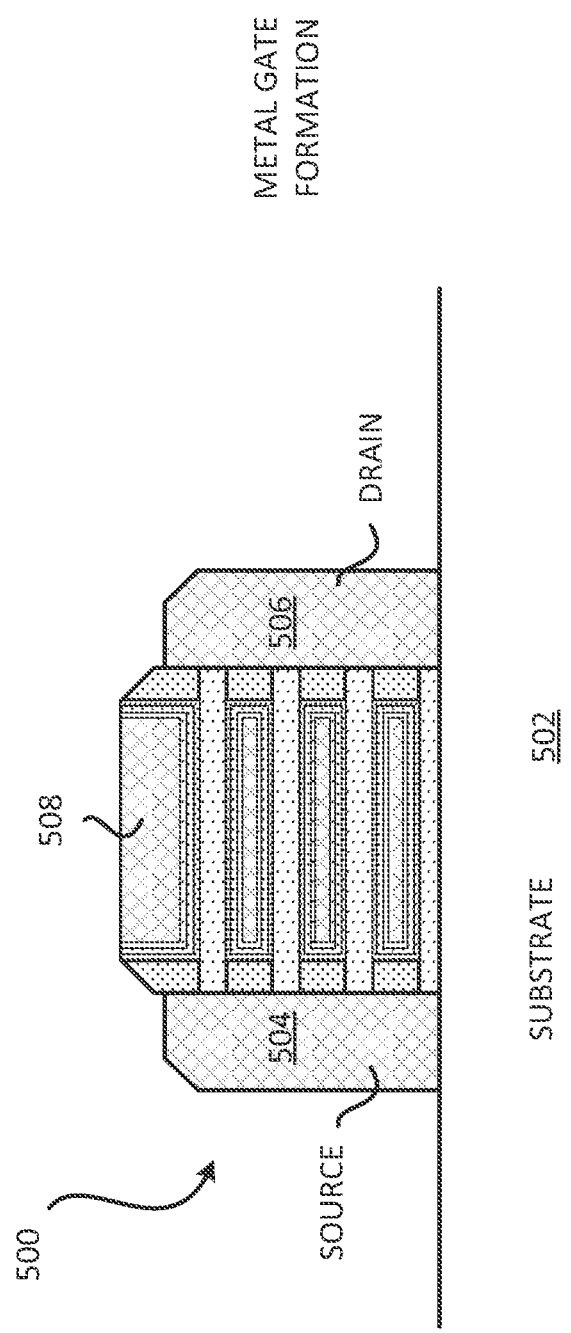

Stage 15, as shown in FIG. 13H, illustrates a state after metal gate formation. After metal gate formation, a metal component (e.g., gate 508) is formed over the third layer 515. The metal component may be located within the cavity previously occupied by the high SiGe layers 1303. The metal component may define the gate 508, or any of the gates described in the disclosure. For purpose of clarity, the oxide layer 1340 and the dielectric layer 1350 are not shown. Stage 15 may illustrate the transistor 500 of FIG. 5, and depending on the doping of the source and the drain, the transistor 700 (e.g., NMOS transistor) or the transistor 900 (e.g., PMOS transistor). In some implementations, additional processes may be performed on the transistor, including a polishing process.

Exemplary Flow Diagram of a Method for Fabricating a Transistor Comprising Channels with Silicon Germanium (SiGe)

Figure 14:
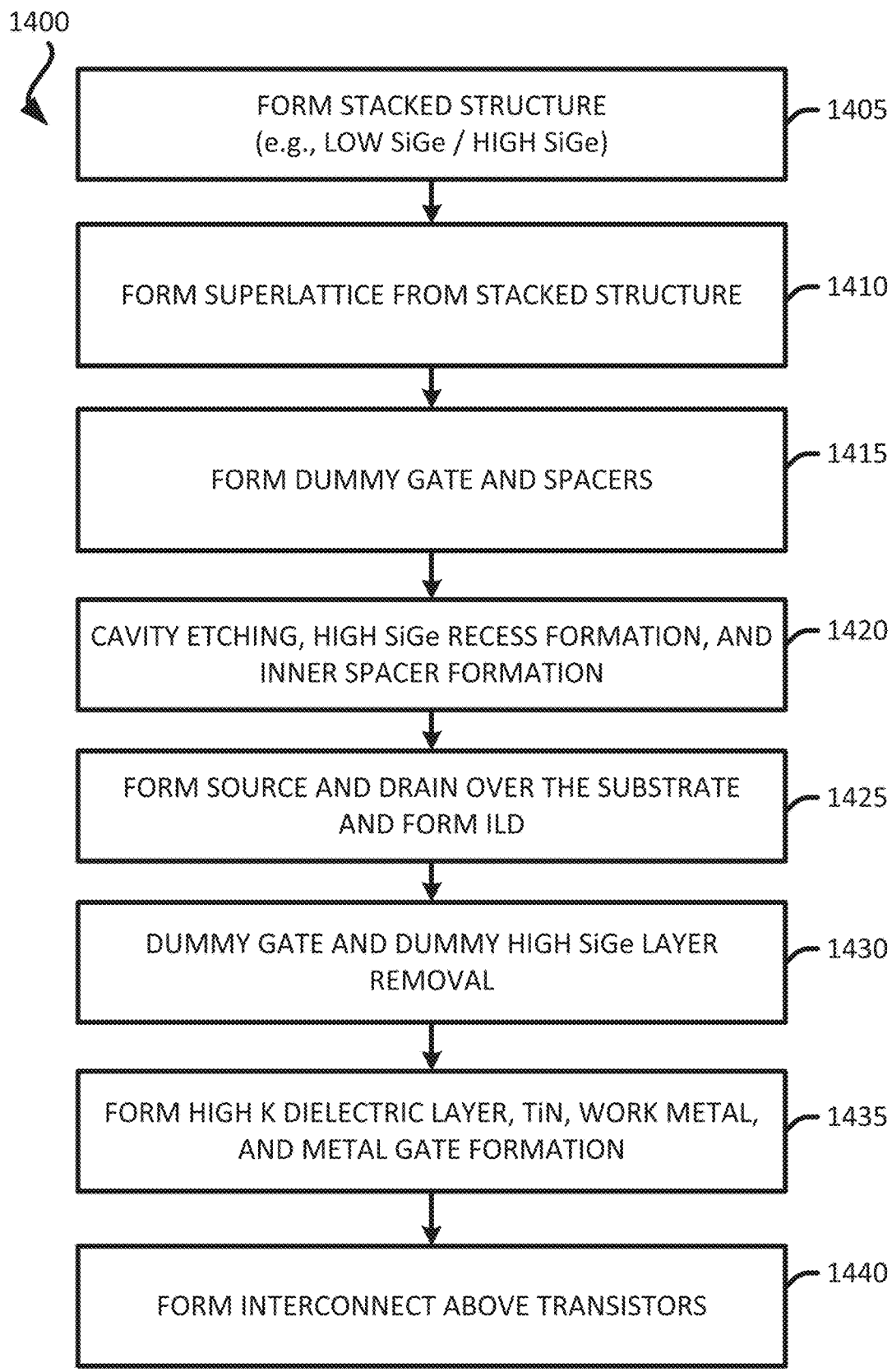
FIG. 14 illustrates an exemplary flow diagram of a method for fabricating a gate-all-around FET.

In some implementations, fabricating a transistor includes several processes. FIG. 14 illustrates an exemplary flow diagram of a method 1400 for providing or fabricating a transistor (e.g., NMOS transistor a PMOS transistor) The transistor may be part of transistors that form a CMOS structure. In some implementations, the method 1400 of FIG. 14 may be used to provide or fabricate the transistor of FIGS. 2, 5-12 and/or other transistors described in the present disclosure.

It should be noted that the sequence of FIG. 14 may combine one or more processes in order to simplify and/or clarify the method for providing or fabricating a transistor. In some implementations, the order of the processes may be changed or modified.

The method forms (at 1405) a stacked structure of alternating layers of low silicon germanium (SiGe) and high silicon germanium (SiGe), over the substrate 502. The stacked structure may be formed over the substrate 502. Different implementations may provide different materials for the substrate 502. In some implementations, the substrate 502 may include silicon (Si). The substrate 502 may include a P substrate or a N substrate. In some implementations, the substrate 502 is not doped. The substrate 502 may include wells (e.g., N well, P well).

The method forms (at 1410) superlattices (e.g., 1301) from the stacked structure. The superlattices may be formed by removing (e.g., etching) portions of the stacked structure. The process of forming the superlattice may include forming a shallow trench isolation (STI) around the superlattice 1301, and exposing the superlattice 1301 by removing portions of the STI.

The method forms (at 1415) a dummy gate and a spacer, where an oxide layer 1310 is formed over the superlattice 1301 (e.g., over a top low SiGe layer) and a dummy gate 1320 is formed over the oxide layer 1310 and the superlattice 1301. In addition, spacers 1316 are formed over the superlattice 1301. More specifically, spacers 1316 are formed over the superlattice 1301 and next to (and on each side of) the dummy gate 1320. It is noted that the spacer 1316 is exemplary. In some implementations, the spacer 1316 may be the spacer 516, or any of the spacers described in the disclosure.

The method performs (at 1420) cavity etching, high SiGe recess formation and inner spacer formation. During cavity etching, portions of the superlattice 1301 not covered by the dummy gate 1320 and/or the spacer 1316 are removed. Cavity etching involves removing portions of the high SiGe layer 1303 of the superlattice 1301. During high SiGe recess formation, portions of the high SiGe layer underneath the spacer 1316 are removed. During inner spacer formation, inner spacer 1318 are formed in the cavity where the high SiGe layer 1303 was previously removed.

The method forms (at 1425) a source and drain, and performs inter level dielectric (ILD) formation. Forming the source and the drain may include disposing (e.g., forming) a source 504 and a drain 506 over the substrate 502 (and/or the wells). Forming the source and the drain may also include doping the source and the drain. For example, the source 504 and the drain 506 may be doped with either an N type dopant (N+) or a P type dopant (P+). Doping the source 504 and the drain 506 with a N type dopant (N+) may produce the source 704 and the drain 706. Doping the source 504 and the drain 506 with a P type dopant (P+) may produce the source 904 and the drain 906. ILD formation may include forming an oxide layer 1340 over the source 504, the drain 506 and the spacer 516. ILD formation may also include forming a dielectric layer 1350 over the oxide layer 1340.

The method performs (at 1430) dummy gate removal, where the dummy gate 1320 and the oxide layer 1310 are removed, exposing portions of the top low SiGe layer 1302. In addition, the method may also perform dummy SiGe removal, where the high SiGe layers 1303 of the superlattice 1301 are removed, leaving cavities between the low SiGe layers 1302. One or more etching processes may be used to remove the dummy gate and the high SiGe layer(s).

The method performs (at 1435) high K dielectric layer formation, TiN formation, work metal formation and gate formation. During high K dielectric layer formation, the first layer 511 (e.g., high K dielectric layer) is formed over the low SiGe layer 1302 between the spacer 1316 in the cavity that was previously occupied by the high SiGe layer 1303. The method may also form a second layer 513 over the first layer 511. The second layer 513 may include TiN. During work metal formation, a third layer 515 may be formed over the second layer 513. During gate formation, a metal component is formed over the third layer 515. The metal component may define the gate 508.

The method forms (at 1440) interconnects above the transistors. The interconnects may be coupled to the gate 508, the source 504 and/or the drain 506.

Exemplary Integrated Device Comprising a Transistor Comprising Channels with Silicon Germanium (SiGe)

Figure 15:
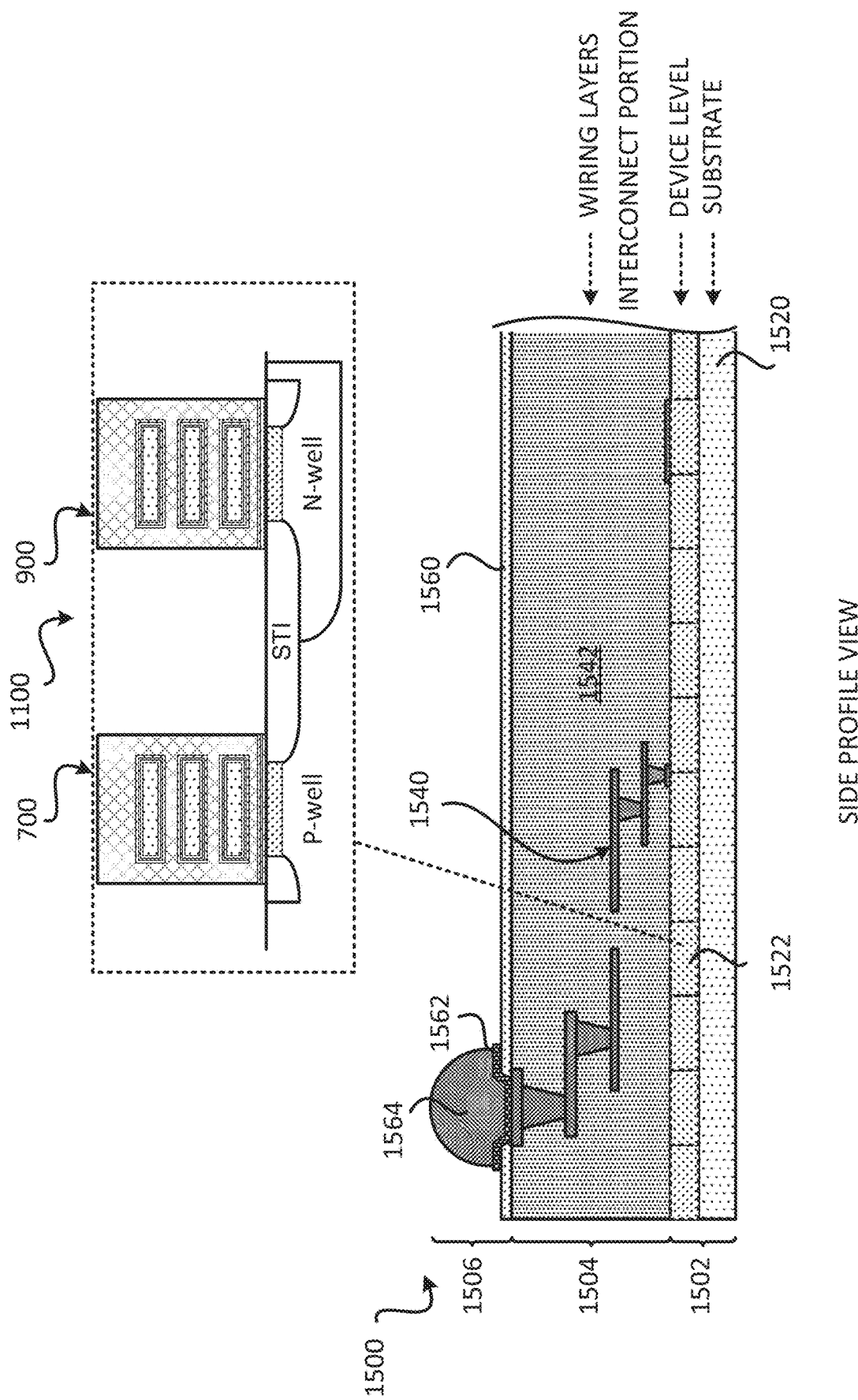
FIG. 15 illustrates a profile view of an integrated device that includes gate-all-around FETs.

FIG. 15 illustrates a profile view of an integrated device 1500 that includes one or more transistors comprising channels with silicon germanium (SiGe). The integrated device 1500 includes a substrate 1520, a plurality of device level cells 1522 (e.g., logic cells), interconnect portion 1504, and a packaging portion 1506. The plurality of device level cells 1522 is formed over the substrate 1520. The plurality of device level cells 1522 may form the device level layer of the integrated device 1500. In some implementations, the plurality of device level cells 1522 may include portions of the substrate 1520. In some implementations, the substrate 1520 and the plurality of device level cells 1522 may be referred as the substrate portion 1502 of the integrated device 1500.

The plurality of device level cells 1522 may include a NMOS transistor, a PMOS transistor and/or a CMOS structure, where at least one transistor includes channels with silicon germanium (SiGe). The plurality of device level cells 1522 may include the cell 400 as described in FIG. 4. As shown in FIG. 15, one of the device level cells includes a structure 1100 (e.g., CMOS structure) that includes the NMOS transistor 700 and the PMOS transistor 900. The NMOS transistor 700 and/or the PMOS transistor 900 may include channels that comprises silicon germanium (SiGe).

In some implementations, the NMOS transistor 700 may be a first transistor (e.g., first transistor means) formed over the substrate 1520. In some implementations, the transistor 700 may include a source 704 (e.g., first source) disposed over the substrate 1520; a drain 706 (e.g., first drain) disposed over the substrate 1520; a plurality of channels 510 (e.g., first plurality of channels) coupled to the source 704 and the drain 706. The plurality of channels 510 is located between the source 704 and the drain 706. At least one channel from the plurality of channels 510 comprises silicon germanium (SiGe). The transistor 700 may include a first gate (e.g., 508, 1208) surrounding the plurality of channels 510.

In some implementations, the PMOS transistor 900 may be a second transistor (e.g., second transistor means) formed over the substrate 1520. In some implementations, the transistor 900 may include a source 904 (e.g., second source) disposed over the substrate 1520; a drain 906 (e.g., second drain) disposed over the substrate 1520; a plurality of channels 510 (e.g., second plurality of channels) coupled to the source 904 and the drain 906. The plurality of channels 510 is located between the source 904 and the drain 906. At least one channel from the plurality of channels 510 comprises silicon germanium (SiGe). The transistor 900 may include a second gate (e.g., 508, 1208) surrounding the plurality of channels 510. In some implementations, the transistor 700 and the transistor 900 may share the same gate.

Different implementations may have different numbers and/or arrangements of CMOS structures, NMOS transistors and/or PMOS transistors. The CMOS structure 1100 may be the CMOS structure 401. It is noted that the integrated device 1500 may include other types of structures, such as the structure 1200 of FIG. 12.

The interconnect portion 1504 is formed over the substrate portion 1502. In particular, the interconnect portion 1504 is formed over the plurality of device level cells 1522. The interconnect portion 1504 includes wiring layers. The interconnect portion 1504 includes a plurality of interconnects 1540 (e.g., trace, pad, vias) and at least one dielectric layer 1542. The interconnect portion 1504 may provide interconnect between the plurality of CMOS structures, NMOS transistors and/or PMOS transistors.

A packaging portion 1506 is formed over the interconnect portion 1504. The packaging portion 1506 includes a passivation layer 1560, an under bump metallization (UBM) layer 1562 and a solder interconnect 1564. It is noted that the size and shape of the integrated device 1500 is exemplary. Moreover, the components of the integrated device 1500 shown may not be to scale.

Exemplary Sequence for Fabricating an Integrated Device Comprising a Transistor Comprising Channels with Silicon Germanium (SiGe)

Figure 16A:
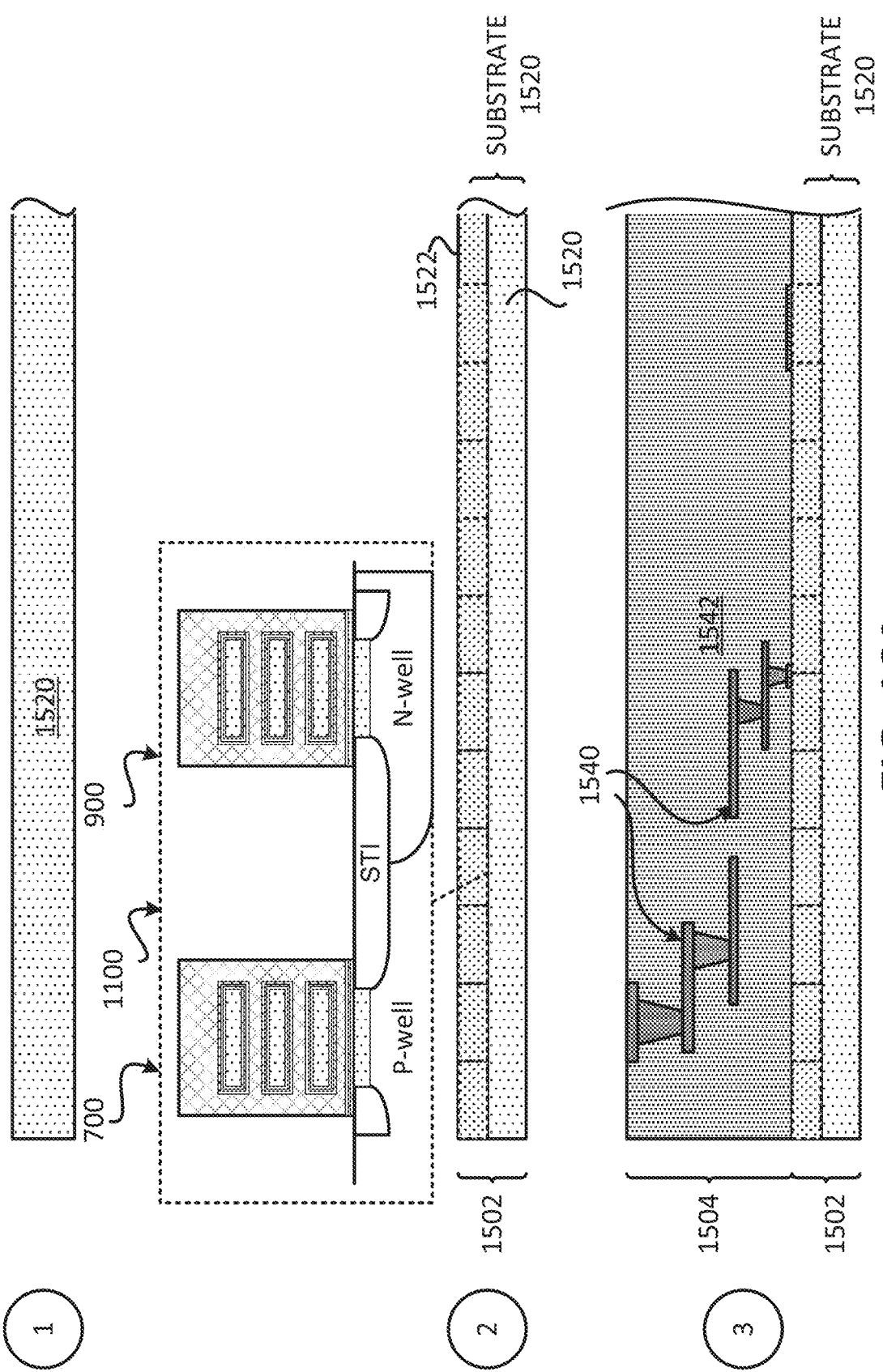
FIG. 16 (comprising FIGS. 16A-16B) illustrates an exemplary sequence for fabricating an integrated device that includes gate-all-around FETs.
Figure 16B:
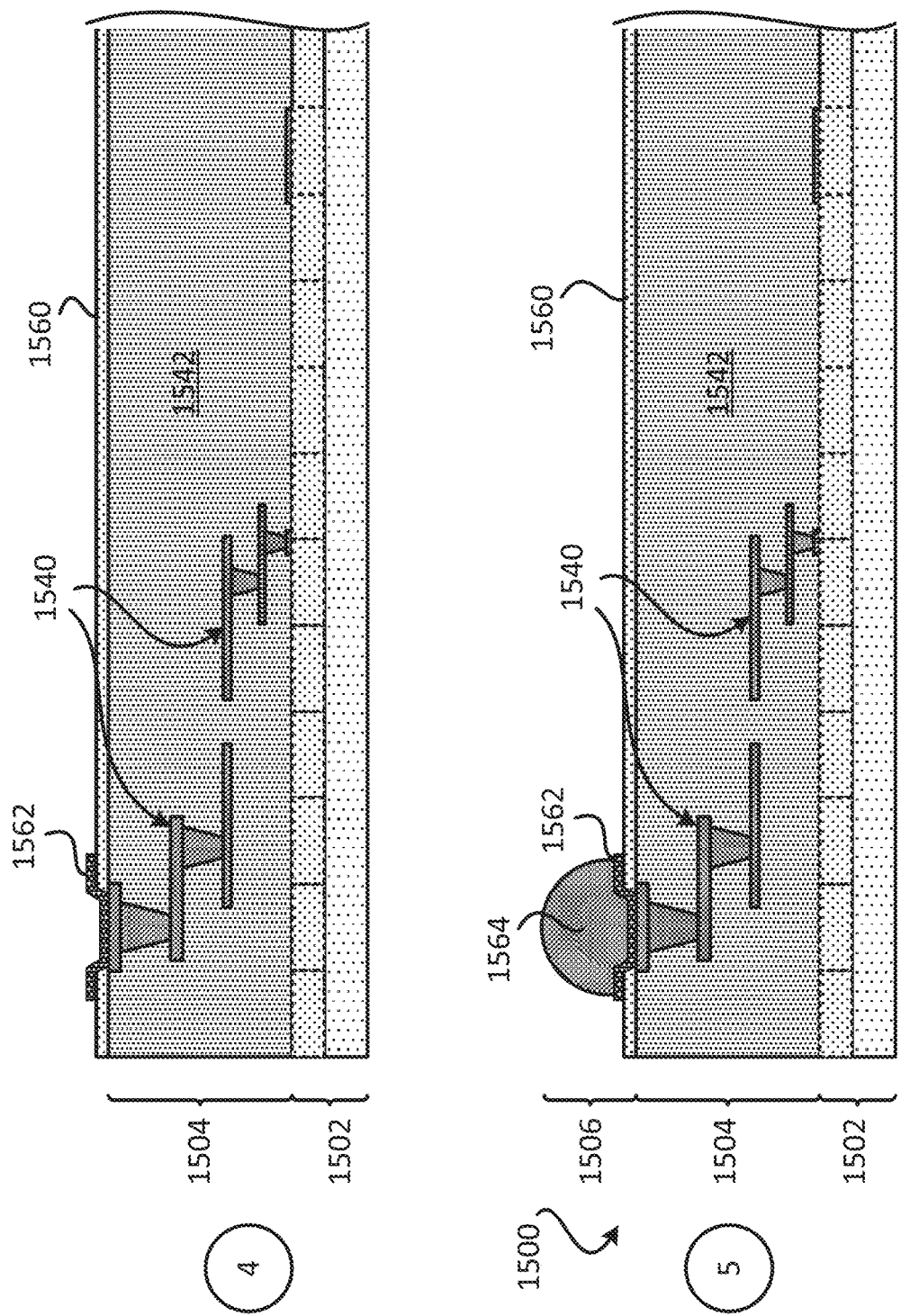

In some implementations, fabricating an integrated device that includes a transistor comprising channels with silicon germanium (SiGe) includes several processes. FIG. 16 (which includes FIGS. 16A-16B) illustrates an exemplary sequence for providing or fabricating an integrated device that includes a NMOS transistor and a PMOS transistor, where at least one of the channels of a transistor includes silicon germanium (SiGe). In some implementations, the sequence of FIGS. 16A-16B may be used to provide or fabricate the integrated device of FIG. 15 and/or other integrated devices described in the present disclosure.

It should be noted that the sequence of FIGS. 16A-16B may combine one or more stages in order to simplify and/or clarify the sequence for providing or fabricating an integrated device that includes a NMOS transistor and a PMOS transistor, where at least one of the channels of a transistor includes silicon germanium (SiGe). In some implementations, the order of the processes may be changed or modified. In some implementations, one or more of processes may be replaced or substituted without departing from the spirit of the disclosure.

Stage 1, as shown in FIG. 16A, illustrates a state after a substrate 1520 is provided. Different implementations may provide different materials for the substrate 1520. In some implementations, the substrate 1520 may include silicon (Si). The substrate may include wells (e.g., N well, P well).

Stage 2 illustrates a state after the device level layer is formed over the substrate 1520. The device level layer includes the plurality of device level cells 1522 (e.g., 400). Thus, Stage 2 illustrates a state after the plurality of device level cells 1522 is formed over the substrate 1520. In some implementations, a front end of line (FEOL) process may be used to fabricate the device level layer (e.g., plurality of device level cells 1522). One or more of cells from the plurality of device level cells may include a NMOS transistor and/or a PMOS transistor, as described above. One or more of the transistors may include channels that have silicon germanium (SiGe). FIGS. 13A-13H illustrate a sequence for fabricating a transistor (e.g., NMOS transistor, a PMOS transistor). In some implementations, interconnects may be formed over the gate, source and/or drain of one or more transistors.

Stage 3 illustrates a state after the interconnect portion 1504 is formed. The interconnect portion 1504 may include plurality of interconnects 1540 and at least one dielectric layer 1542. In some implementations, a back end of line (BEOL) process may be used to fabricate interconnect portion 1504. The interconnect portion 1504 may be configured to electrically couple one or more NMOS transistors, one or more PMOS transistors, one or more CMOS structures having a NMOS transistor and a PMOS transistor.

Stage 4, as shown in FIG. 16B, illustrates a state after a passivation layer 1560 and the under bump metallization (UBM) layer 1562 are formed over the interconnect portion 1504.

Stage 5 illustrates a state after a solder interconnect is coupled to the under bump metallization (UBM) layer 1562. Stage 15 may illustrate the integrated device 1500 of FIG. 15.

Exemplary Flow Diagram of a Method for Fabricating an Integrated Device Comprising a Transistor Having Channels with Silicon Germanium (SiGe)

Figure 17:
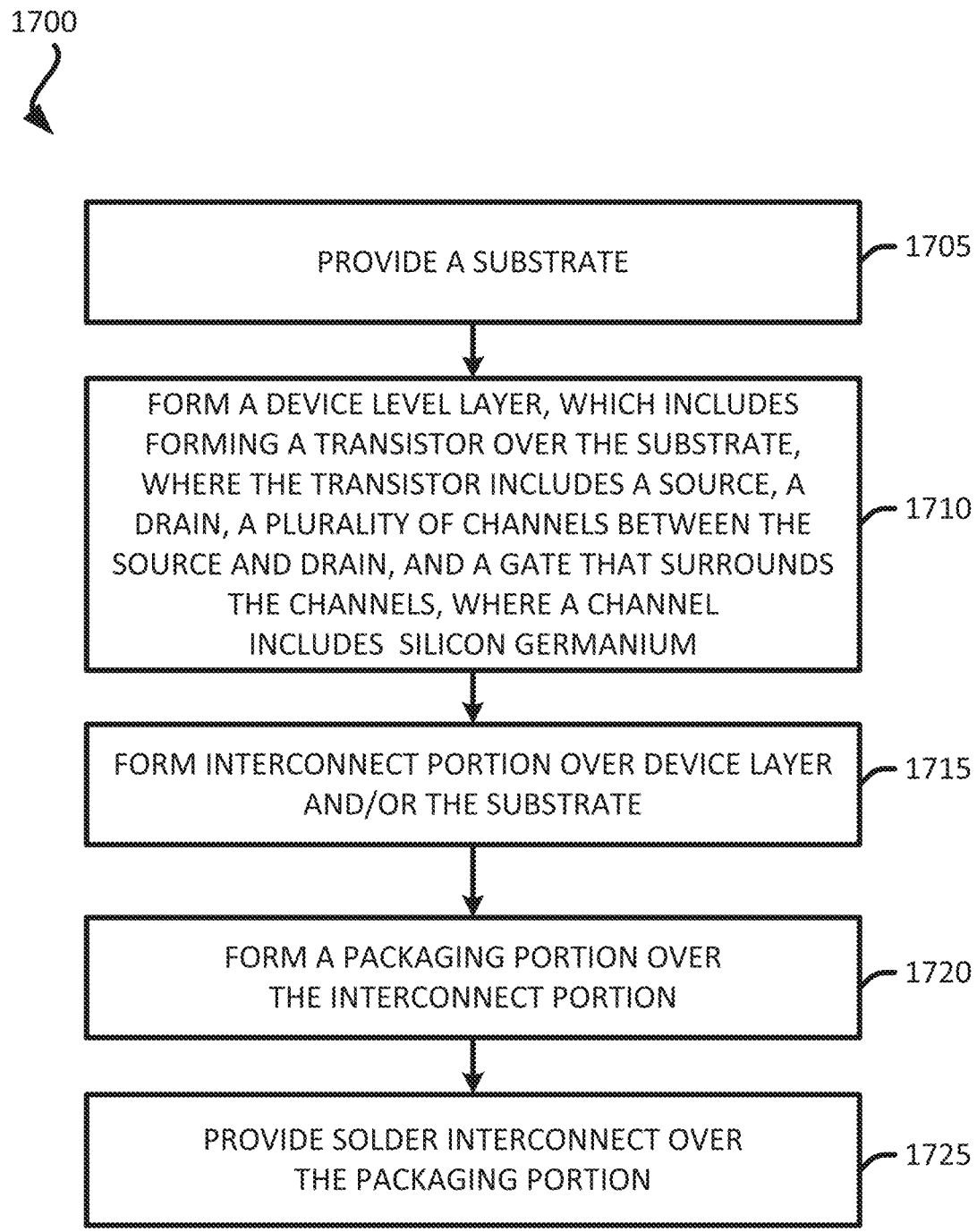
FIG. 17 illustrates an exemplary flow diagram of a method for fabricating an integrated device that includes gate-all-around FETs.

In some implementations, providing an integrated device that includes a transistor comprising channels with silicon germanium (SiGe) includes several processes. FIG. 17 illustrates an exemplary flow diagram of a method 1700 for providing or fabricating an integrated device that includes a transistor comprising channels with silicon germanium (SiGe). In some implementations, the method 1700 of FIG. 17 may be used to provide or fabricate the integrated device of FIG. 15 and/or other integrated devices described in the present disclosure.

It should be noted that the sequence of FIG. 17 may combine one or more processes in order to simplify and/or clarify the method for providing or fabricating an integrated device that includes a transistor comprising channels with silicon germanium (SiGe). In some implementations, the order of the processes may be changed or modified.

The method provides (at 1705) a substrate (e.g., 1520). Different implementations may provide different materials for the substrate. In some implementations, the substrate may include silicon (Si). The substrate may be doped with an N type dopant or a P type dopant. Providing the substrate may include forming wells (e.g., N well, P well) in the substrate.

The method forms (at 1710) a device level layer (e.g., the plurality of device level cells 1522) over the substrate. In some implementations, a front end of line (FEOL) process may be used to fabricate the device level layer (e.g., plurality of device level cells 1522). The device level layer may include a plurality of device level cells (e.g., 400). The device level cells may include one or more active devices (e.g., transistor). One or more device level cells may include a structure having a NMOS transistor and/or a PMOS transistor, as described in the disclosure. Forming the device level layer may include forming one or more NMOS transistors (e.g., 700) and/or one or more PMOS transistors (e.g., 900). As mentioned above the NMOS transistors and/or the PMOS transistors may be gate all around (GAA) transistors. One of more the transistors may include channels that have silicon germanium (SiGe). In some implementations, forming a device level layer includes forming a first transistor over the substrate. Forming the first transistor may include forming a first source over the substrate, forming a first drain over the substrate, forming a first plurality of channels between the first source and the first drain, where at least one channel from the first plurality of channels comprises silicon germanium (SiGe). Forming a first transistor may also include forming a first gate that surrounds the channels. FIGS. 13A-13H illustrate an example of forming a transistor over a substrate.

The method forms (at 1715) an interconnect portion 1504 over the device level layer (e.g., plurality of device level cells 1522) and/or the substrate 1520. The interconnect portion 1504 may include a plurality of interconnect 1540 and at least one dielectric layer 1542. In some implementations, a back end of line (BEOL) process may be used to form the interconnect portion 1904. The interconnect portion 1504 may be configured to electrically couple one or more transistors, and/or one or more CMOS structures having a NMOS transistor and a PMOS transistor.

The method forms (at 1720) a packaging portion 1506 over the interconnect portion 1904. The packaging portion 1506 may include the passivation layer 1560 and the under bump metallization (UBM) layer 1562. The passivation layer 1560 and the under bump metallization (UBM) layer 1562 are formed over the interconnect portion 1504.

The method provides (at 1725) a solder interconnect 1564. In some implementations, the solder interconnect 1564 is coupled to the under bump metallization (UBM) layer 1562

It is also noted that the method 1700 of FIG. 17 may be used to fabricate (e.g., concurrently fabricate) several integrated devices on a wafer. The wafer is then singulated (e.g., cut) into individual integrated devices. These singulated integrated devices may then be coupled to other integrated devices and/or printed circuit boards (PCBs).

Exemplary Electronic Devices

Figure 18:
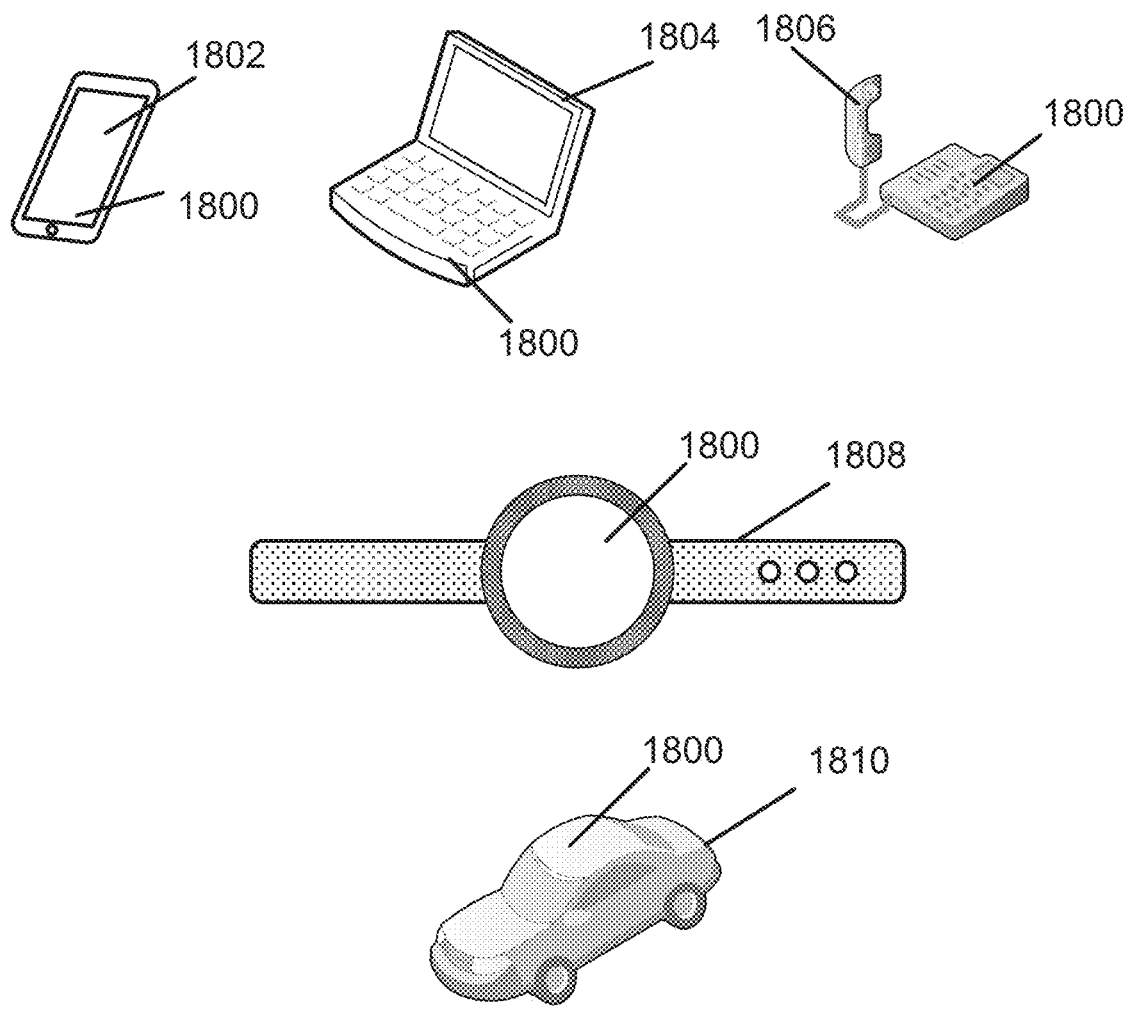
FIG. 18 illustrates various electronic devices that may integrate a die, an integrated device, an integrated passive device (IPD), a device package, a package, an integrated circuit and/or PCB described herein.

FIG. 18 illustrates various electronic devices that may be integrated with any of the aforementioned transistor, CMOS, NMOS transistor, PMOS transistor, device, integrated device, integrated circuit (IC) package, integrated circuit (IC) device, semiconductor device, integrated circuit, die, interposer, package or package-on-package (PoP). For example, a mobile phone device 1802, a laptop computer device 1804, a fixed location terminal device 1806, or a wearable device 1808 may include a device 1800 as described herein. The device 1800 may be, for example, any of the devices and/or integrated circuit (IC) packages described herein. The devices 1802, 1804, 1806 and 1808 illustrated in FIG. 18 are merely exemplary. Other electronic devices may also feature the device 1800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-12, 13A-13H, 14, 15, 16A-16B and/or 17-18 may be rearranged and/or combined into a single component, process, feature or function or embodied in several components, processes, or functions. Additional elements, components, processes, and/or functions may also be added without departing from the disclosure. It should also be noted FIGS. 2-12, 13A-13H, 14, 15, 16A-16B and/or 17-18 and its corresponding description in the present disclosure is not limited to dies and/or ICs. In some implementations, FIGS. 2-12, 13A-13H, 14, 15, 16A-16B and/or 17-18 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC)

package, a wafer, a semiconductor device, a package-on-package (PoP) device, and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional. The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term etching may include dry etching or wet etching, and may involve the use of a mask. Forming or disposing a metal may include a plating process, a chemical vapor deposition (CVP) process, and/or an atomic layer deposition (ALD) process. In some implementations, forming one or more dielectric layers, Si, and/or SiGe may include one or more deposition processes.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:
a substrate; and
a first transistor formed over the substrate, the first transistor comprising:
a first source disposed over the substrate;
a first drain disposed over the substrate;
a first plurality of channels coupled to the first source and the first drain,
wherein the first plurality of channels is located between the first source and the first drain, and
wherein at least one channel from the first plurality of channels comprises silicon germanium (SiGe);
a plurality of inner spacers located between the first source and the first drain;
a first gate surrounding the first plurality of channels; and
a bottom silicon germanium (SiGe) layer located in the substrate.

2. The device of claim 1, wherein the at least one channel comprising silicon germanium (SiGe) includes a germanium concentration in a range of about 2-8 percent (%).

3. The device of claim 1,
wherein the first source and the first drain, each includes N type dopant (N+), and
wherein the first transistor is configured to operate as a negative channel metal oxide semiconductor (NMOS) transistor.

4. The device of claim 1,
wherein the first source and the first drain, each includes P type dopant (P+), and
wherein the first transistor is configured to operate as a positive channel metal oxide semiconductor (PMOS) transistor.

5. The device of claim 1, wherein a minimum voltage required to induce a current flow in the first transistor is approximately 0.3 volts (V).

6. The device structure of claim 1, wherein each channel from the first plurality of channels has a channel thickness of approximately 5-10 nanometers (nm).

7. The device of claim 1, further comprising a high K dielectric layer between a channel and the first gate.

8. The device of claim 7, further comprising a titanium nitride (TiN) layer between a channel and the first gate.

9. The device of claim 8, further comprising a work metal layer between a channel and the first gate.

10. The device of claim 1, wherein the device is incorporated into an electronic device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

11. The device of claim 1, wherein the bottom silicon germanium (SiGe) layer is part of the plurality of channels of the first transistor.

12. The device of claim 1, wherein the bottom silicon germanium (SiGe) layer is located under a channel from the first plurality of channels.

13. The device of claim 1, further comprising a high k dielectric layer, a metal layer, and/or a work function metal layer, located between the bottom silicon germanium (SiGe) layer and the first gate.

14. The device of claim 1, wherein the plurality of inner spacers comprises:
a first inner spacer located between a first channel and the first source; and
a second inner spacer located between the first channel and the first drain.

15. An integrated device comprising:
a substrate;

a first transistor formed over the substrate, the first transistor comprising:
a first source disposed over the substrate;
a first drain disposed over the substrate;
a first plurality of channels coupled to the first source and the first drain,
wherein the first plurality of channels is located between the first source and the first drain, and
wherein at least one channel from the first plurality of channels comprises silicon germanium (SiGe),
a first plurality of inner spacers located between the first source and the first drain;
a first gate surrounding the first plurality of channels; and
a first bottom silicon germanium (SiGe) layer located in the substrate, wherein the first bottom silicon germanium (SiGe) layer is located under a channel from the first plurality of channels; and
a second transistor formed over the substrate, the second transistor comprising:
a second source disposed over the substrate;
a second drain disposed over the substrate;
a second plurality of channels coupled to the second source and the second drain,
wherein the second plurality of channels is located between the second source and the second drain, and
wherein at least one channel from the second plurality of channels comprises silicon germanium (SiGe);
a second plurality of inner spacers located between the second source and the second drain;
a second gate surrounding the second plurality of channels; and
a second bottom silicon germanium (SiGe) layer located in the substrate, wherein the second bottom silicon germanium (SiGe) layer is located under a channel from the second plurality of channels.

16. The integrated device of claim 15, wherein the at least one channel comprising silicon germanium (SiGe) includes a germanium concentration in a range of about 2-8 percent (%).

17. The integrated device of claim 15,
wherein the first transistor configured to operate as a negative channel metal oxide semiconductor (NMOS) transistor, and
wherein the second transistor configured to operate as a positive channel metal oxide semiconductor (PMOS) transistor.

18. The integrated device of claim 17,
wherein the first transistor further comprises a first titanium nitride (TiN) layer between the first gate and a channel from the first plurality of channels, the first TiN layer having a first thickness,
wherein the second transistor further comprises a second titanium nitride (TiN) layer between the second gate and a channel from the second plurality of channels, the second TiN layer having a second thickness, and
wherein the second thickness of the second TiN layer is greater than the first thickness of the first TiN layer.

19. The integrated device of claim 15,
wherein the substrate includes a P-well and a N-well,
wherein the first transistor is formed over the P well of the substrate, and
wherein the second transistor is formed over the N well of the substrate.

20. The integrated device of claim 15, wherein the first gate and the second gate are different gates.

21. The integrated device of claim 15, wherein the first gate and the second gate are part of the same gate.

22. The integrated device of claim 15, wherein the first transistor and the second transistor are configured to form a complementary metal-oxide-semiconductor (CMOS) structure.

23. The integrated device of claim 15, wherein the integrated device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

24. An apparatus comprising:
a substrate;
a first transistor means formed over the substrate, the first transistor means comprising:
a first source disposed over the substrate;
a first drain disposed over the substrate;
a first plurality of channels coupled to the first source and the first drain,
wherein the first plurality of channels is located between the first source and the first drain, and
wherein at least one channel from the first plurality of channels comprises silicon germanium (SiGe);
a first plurality of inner spacers located between the first source and the first drain; and
a first gate surrounding the first plurality of channels; and
a first bottom silicon germanium (SiGe) layer located in the substrate, wherein the first bottom silicon germanium (SiGe) layer is located under a channel from the first plurality of channels; and
a second transistor means formed over the substrate, the second transistor means comprising:
a second source disposed over the substrate;
a second drain disposed over the substrate;
a second plurality of channels coupled to the second source and the second drain,
wherein the second plurality of channels is located between the second source and the second drain, and
wherein at least one channel from the second plurality of channels comprises silicon germanium (SiGe);
a second plurality of inner spacers located between the second source and the second drain; and
a second gate surrounding the second plurality of channels; and
a second bottom silicon germanium (SiGe) layer located in the substrate, wherein the second bottom silicon germanium (SiGe) layer is located under a channel from the second plurality of channels.

25. The apparatus of claim 24, wherein the at least one channel comprising silicon germanium (SiGe) includes a germanium concentration in a range of about 2-8 percent (%).

26. The apparatus of claim 24,
wherein the first transistor means is configured to operate as a negative channel metal oxide semiconductor (NMOS) transistor, and
wherein the second transistor means is configured to operate as a positive channel metal oxide semiconductor (PMOS) transistor.

27. The apparatus of claim 26,
wherein the first transistor means further comprises a first titanium nitride (TiN) layer between the first gate and a channel from the first plurality of channels, the first TiN layer having a first thickness,
wherein the second transistor means further comprises a second titanium nitride (TiN) layer between the second gate and a channel from the second plurality of channels, the second TiN layer having a second thickness, and
wherein the second thickness of the second TiN layer is greater than the first thickness of the first TiN layer.

28. The apparatus of claim 24,
wherein the substrate includes a P-well and a N-well,
wherein the first transistor means is formed over the P well of the substrate, and
wherein the second transistor means is formed over the N well of the substrate.

29. The apparatus of claim 24, wherein the first transistor means and the second transistor means are configured to form a complementary metal-oxide-semiconductor (CMOS) structure.

30. The apparatus of claim 24, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

31. A method for fabricating an integrated device, comprising:
providing a substrate; and
forming a first transistor over the substrate, wherein forming the first transistor comprises:
forming a bottom silicon germanium (SiGe) layer in the substrate;
forming a first source over the substrate;
forming a first drain over the substrate;
forming a first plurality of channels between the first source and the first drain, wherein at least one channel from the first plurality of channels comprises silicon germanium (SiGe);
forming a first plurality of inner spacers between the first source and the first drain; and
forming a first gate surrounding the first plurality of channels.

32. The method of claim 31, wherein forming the first plurality of channels comprises forming at least one channel comprising silicon germanium (SiGe) having a germanium concentration in a range of about 2-8 percent (%).

33. The method of claim 31, further forming a second transistor over the substrate, wherein forming the second transistor comprises:
forming a second source over the substrate;
forming a second drain over the substrate;
forming a second plurality of channels between the second source and the second drain, wherein at least one channel from the second plurality of channels comprises silicon germanium (SiGe);
forming a second plurality of inner spacers between the second source and the second drain; and
forming a second gate surrounding the second plurality of channels.

34. The method of claim 33, wherein the first gate and the second gate are part of the same gate.

* * * * *